(12) United States Patent
Kim et al.

(10) Patent No.: US 12,426,158 B2
(45) Date of Patent: Sep. 23, 2025

(54) DISPLAY DEVICE INCLUDING A CIRCUIT BOARD HAVING A HOLE OVERLAPPING AN ALIGNMENT MARK

(71) Applicant: Samsung Display Co., LTD., Yongin-si (KR)

(72) Inventors: Hyung Jin Kim, Yongin-si (KR); Hyang Won Moon, Yongin-si (KR); Hyeok Tae Kwon, Yongin-si (KR); Si Hyung An, Yongin-si (KR); Geun Yeong Chang, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 243 days.

(21) Appl. No.: 18/195,454

(22) Filed: May 10, 2023

(65) Prior Publication Data

US 2024/0098894 A1    Mar. 21, 2024

(30) Foreign Application Priority Data

Sep. 20, 2022    (KR) ......................... 10-2022-0118395

(51) Int. Cl.
*H05K 1/11*        (2006.01)
*H05K 1/02*        (2006.01)

(52) U.S. Cl.
CPC ........... *H05K 1/111* (2013.01); *H05K 1/0266* (2013.01); *H05K 1/0271* (2013.01)

(58) Field of Classification Search
CPC .... H10D 86/411; H10D 86/441; H05K 1/189; H05K 3/323; H05K 3/3436;
(Continued)

(56) References Cited

U.S. PATENT DOCUMENTS 5,838,412 A * 11/1998 Ueda ...................... H05K 1/028
                                                              349/150
2004/0183984 A1* 9/2004 Imajo .................. G02F 1/13452
                                                              349/151
(Continued)

FOREIGN PATENT DOCUMENTS

KR      19990012596         2/1999
KR      20170080893         7/2017
KR      20210121351         10/2021

*Primary Examiner* — Timothy J Thompson
*Assistant Examiner* — Michael F McAllister
(74) *Attorney, Agent, or Firm* — CANTOR COLBURN LLP

(57) ABSTRACT

A display device includes a substrate including a display area including pixels and a non-display area around the display area and including a pad area, and a circuit board attached to the pad area. Pad electrodes arranged along a first direction and a first alignment mark located at a side of the pad electrodes in the first direction and protruding more than the pad electrodes are disposed on the substrate in the pad area. The circuit board includes a base portion, and lead electrodes disposed on the base portion and respectively facing the pad electrodes. A first alignment mark hole is defined through the base portion at a side of the lead electrodes in the first direction, the first alignment mark and the first alignment mark hole have a same shape as each other, and the first alignment mark is accommodated in the first alignment mark hole.

20 Claims, 24 Drawing Sheets

(58) Field of Classification Search
CPC .......... H05K 2201/09918; H05K 2201/10128; H05K 1/111; H05K 1/0266; H05K 1/0271
USPC .................................................. 361/679.01
See application file for complete search history.

(56) References Cited

U.S. PATENT DOCUMENTS

2006/0291179 A1* 12/2006 Tanimori ............... H05K 3/361
 361/784
2016/0188059 A1* 6/2016 Lee ....................... G06F 3/0412
 345/173

* cited by examiner

DISPLAY DEVICE INCLUDING A CIRCUIT BOARD HAVING A HOLE OVERLAPPING AN ALIGNMENT MARK

This application claims priority to Korean Patent Application No. 10-2022-0118395, filed on Sep. 20, 2022, and all the benefits accruing therefrom under 35 U.S.C. § 119, the content of which in its entirety is herein incorporated by reference.

BACKGROUND

1. Field

The disclosure relates to a display device.

2. Description of the Related Art

As the information society develops, demands for display devices for displaying images are increasing in various forms. For example, display devices are applied to various electronic devices such as smartphones, digital cameras, notebook computers, navigation devices, and smart televisions. The display devices may be flat panel display devices such as liquid crystal display devices, field emission display devices, and organic light emitting display devices.

A driving chip may function as a data driver or a scan driver and may be mounted on a substrate of a display panel using a chip on glass (COG) method. A printed circuit board may output a signal for controlling the driving chip to the driving chip and may be formed as a flexible printed circuit (FPC) that can be bent.

In such a display device, a data voltage and/or a scan signal may be applied from an external device to drive a screen thereof. Here, as the resolution of the display device increases, the number of input pad electrodes for receiving the data voltage and/or the scan signal from the external device may be increased.

SUMMARY

In a display device, input pad electrodes may be electrically connected to lead electrodes of an external device, for example, a printed circuit film, to receive a data voltage and/or a scan signal from the external device. In such a display device, it is desired to precisely align the input pad electrodes, the number of which are substantially large at high resolution, with the lead electrodes corresponding to the input pad electrodes to prevent a screen driving failure of the display device.

Embodiments of the disclosure provide a display device which can reduce an alignment tolerance by preventing lifting of lead electrodes disposed on a side surface of a printed circuit board attached to a pad area of a display panel.

An embodiment of a display device includes a display device including a substrate including a display area including a plurality of pixels and a non-display area located around the display area and including a pad area, and a circuit board attached to the pad area, where a plurality of pad electrodes arranged along a first direction is on the substrate in the pad area a first alignment mark located at a side of the pad electrodes in the first direction and protruding more than the pad electrodes in a thickness direction of the substrate is disposed on the substrate in the pad area, and the circuit board includes a base portion, and a plurality of lead electrodes disposed on the base portion and respectively facing the pad electrodes, where a first alignment mark hole is defined through the base portion in the thickness direction at a side of the lead electrodes in the first direction, a shape of the first alignment mark is the same as a shape of the first alignment mark hole, and the first alignment mark is accommodated in the first alignment mark hole.

In an embodiment, the first alignment mark may include a same material as the pad electrodes.

In an embodiment, a thickness of the pad electrodes may be in a range of ¼ to ⅓ of a thickness of the first alignment mark.

In an embodiment, the first alignment mark may include a first portion extending in a second direction intersecting the first direction and a second portion extending from the first portion toward a first side in the first direction.

In an embodiment, the first alignment mark may further include a third portion extending from the first portion toward a second side in the first direction.

In an embodiment, the first alignment mark may have a same shape as the pad electrodes.

In an embodiment, a second alignment mark located at an opposing side of the pad electrodes in the first direction and protruding more than the pad electrodes in the thickness direction may be disposed on the substrate in the pad area, a second alignment mark hole may be defined through the base portion in the thickness direction at an opposing side of the lead electrodes in the first direction, where a shape of the second alignment mark may be the same as a shape of the second alignment mark hole, and the second alignment mark may be accommodated in the second alignment mark hole.

In an embodiment, the shape of the first alignment mark and the shape of the second alignment mark may be different from each other.

In an embodiment, a third alignment mark located at a side of the first alignment mark in the first direction and protruding more than the pad electrodes in the thickness direction may be disposed on the substrate in the pad area, and a third alignment mark hole may be defined through the base portion in the thickness direction at a side of the first alignment mark hole in the first direction,
where the shape of the third alignment mark may be the same as the shape of the third alignment mark hole, and the third alignment mark may be accommodated in the third alignment mark hole.

In an embodiment, a third alignment mark located between the pad electrodes and protruding more than the pad electrodes in the thickness direction may be disposed on the substrate in the pad area, and a third alignment mark hole may be defined through the base portion in the thickness direction at a position between the lead electrodes and completely penetrating the base portion in the thickness direction, where the third alignment mark may be accommodated in the third alignment mark hole.

In an embodiment, the circuit board may include a rigid material.

In an embodiment, the first alignment mark may be surrounded by inner surfaces of the first alignment mark hole in a plan view.

In an embodiment, a side surfaces of the first alignment mark may face the inner surfaces of the first alignment mark hole.

In an embodiment, the display device may further include an anisotropic conductive film disposed between the pad area of the substrate and the circuit board, where the anisotropic conductive film may include an adhesive member and a plurality of conductive balls dispersed in the adhesive member, where the pad electrodes and the lead electrodes may be electrically connected to each other through the conductive balls.

In an embodiment, the anisotropic conductive film may directly contact the side surfaces and upper surface of the first alignment mark and the inner surfaces of the first alignment mark hole and fills the first alignment mark hole.

An embodiment of a display device includes a display device a substrate including a display area including a plurality of pixels and a non-display area located around the display area and including a pad area, a circuit board attached to the pad area, and a plurality of driving chips arranged along a first direction on the substrate in the non-display area between the display area and the pad area and electrically connected to the pixels and the circuit board, where a plurality of pad electrodes arranged along the first direction and a first alignment mark located at a side of the pad electrodes in the first direction and protruding more than the pad electrodes in a thickness direction are disposed on the substrate in the pad area, and the circuit board includes a base portion including a first surface and a second surface opposite to the first surface, a plurality of lead electrodes disposed on the second surface of the base portion and respectively facing the pad electrodes, and a first alignment mark accommodating portion defined at a side of the lead electrodes in the first direction and recessed from the second surface toward the first surface of the base portion, where the first alignment mark and the first alignment mark accommodating portion have a same shape as each other, and the first alignment mark is accommodated in the first alignment mark accommodating portion.

In an embodiment, the display device may further include a second alignment mark located at an opposing side of the pad electrodes in the first direction, protruding more than the pad electrodes in the thickness direction, and having a same shape as the first alignment mark, and the circuit board may further include a second alignment mark accommodating portion defined at an opposing side of the lead electrodes in the first direction and recessed from the second surface toward the first surface of the base portion, where the second alignment mark and the second alignment mark accommodating portion may have a same shape as each other, and the second alignment mark may be accommodated in the second alignment mark accommodating portion.

In an embodiment, the display device may further include an anisotropic conductive film disposed between the pad area of the substrate and the circuit board, where the anisotropic conductive film may include an adhesive member and a plurality of conductive balls dispersed in the adhesive member, where the pad electrodes and the lead electrodes are electrically connected to each other through the conductive balls.

In an embodiment, the anisotropic conductive film may be disposed between the first alignment mark and the first alignment mark accommodating portion and between the second alignment mark and the second alignment mark accommodating portion.

In an embodiment, the anisotropic conductive film may not overlap the first alignment mark, the first alignment mark accommodating portion, the second alignment mark and the second alignment mark accommodating portion, the first alignment mark may directly contact the first alignment mark accommodating portion, and the second alignment mark may directly contact the second alignment mark accommodating portion.

The display device according to an embodiment may include an alignment mark which is thicker than a plurality of pad electrodes, in a pad area, and a printed circuit board is attached to the pad area, and an alignment mark hole is defined in the printed circuit board and is physically coupled to the alignment mark.

Accordingly, in such an embodiment, when the printed circuit board is bonded to the pad area of the display panel, it is possible to prevent the lifting of the lead electrodes disposed at the side of the printed circuit board due to the difference in the thermal expansion coefficient of the substrate of the display panel and the printed circuit board, and to reduce the alignment tolerance between the pad electrodes and the lead electrodes.

BRIEF DESCRIPTION OF THE DRAWINGS

These and/or other features of embodiments of the invention will become apparent and more readily appreciated from the following description of the embodiments, taken in conjunction with the accompanying drawings, in which.

DETAILED DESCRIPTION

Figure 1:
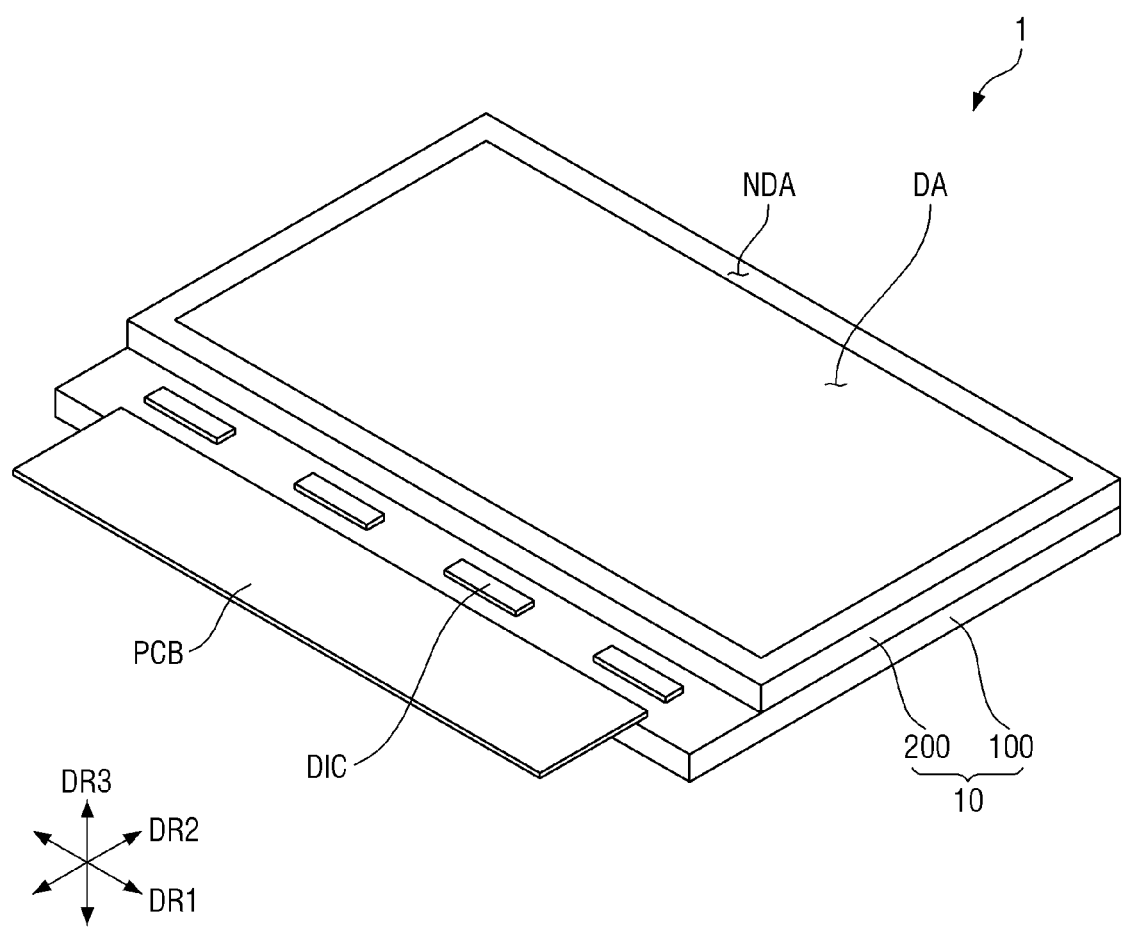
FIG. 1 is a perspective view of a display device according to an embodiment.

The invention will now be described more fully hereinafter with reference to the accompanying drawings, in which various embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, embodiments of the disclosure will be described with reference to the accompanying drawings.

Figure 2:
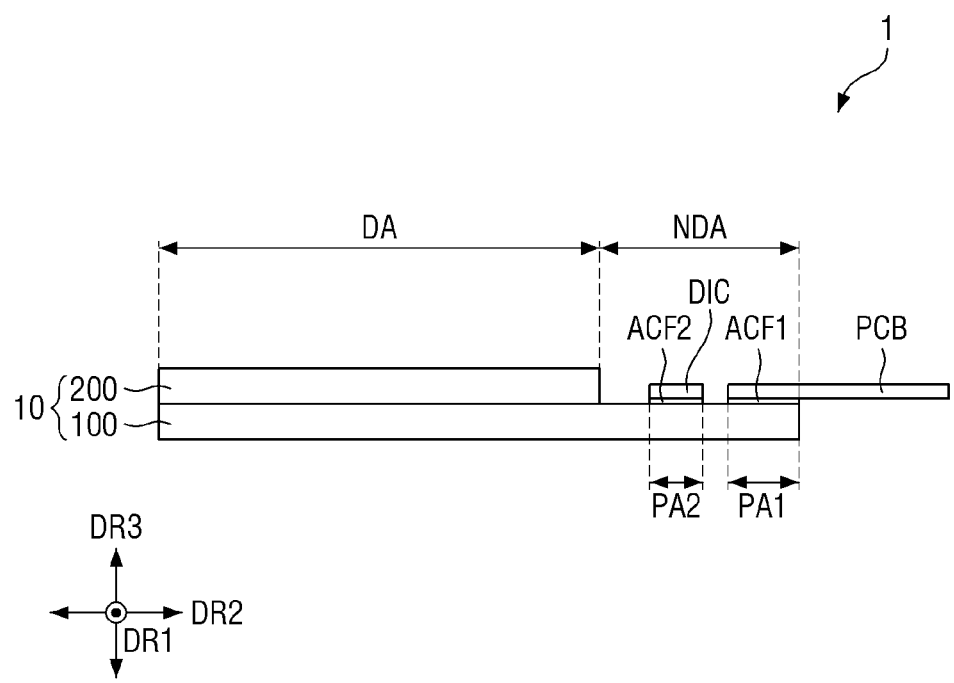
FIG. 2 is a schematic cross-sectional view of the display device of FIG. 1.

FIG. 1 is a perspective view of a display device 1 according to an embodiment. FIG. 2 is a schematic cross-sectional view of the display device 1 of FIG. 1.

In the drawings, a thickness direction of the display device 1 is indicated by a third direction DR3. A front surface (or an upper surface) and a rear surface (or a lower surface) of each element described below are distinguished from each other by the third direction DR3. However, first, second, third directions DR1, DR2, DR3 illustrated in the drawings are only an example. Hereinafter, first through third directions are defined as directions respectively indicated by the first through third directions DR1 through DR3 shown in the drawings.

Referring to FIGS. 1 and 2, the display device 1 displays moving images or still images. The display device 1 may refer to any electronic device that provides a display screen, for example, a television, a notebook computer, a monitor, a billboard, an Internet of things (IoT) device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game console, a digital camera or a camcorder, all of which provide a display screen.

The display device 1 includes a display panel 10 that provides a display screen, for example, a light emitting diode display panel, an organic light emitting display panel, a quantum dot light emitting display panel, a plasma display panel, or a field emission display panel. Hereinafter, for convenience of description, embodiment where the display panel 10 is a light emitting diode display will hereinafter be described in detail, but the disclosure is not limited thereto, and other display panels can also be applied as long as the same technical spirit is applicable.

In an embodiment, as illustrated in FIG. 1, the display device 1 may include a display area DA displaying an image and a non-display area NDA disposed around the display area DA. That is, the display area DA may be parallel to a plane defined by the first direction DR1 and the second direction DR2. The non-display area NDA is defined along edges of the display area DA.

In an embodiment, the display area DA may have a rectangular shape with right-angled corners or a rectangular shape with rounded corners in a plan view, that is, when viewed in the third direction DR3. The planar shape of the display area DA is not limited to a rectangular shape, but may also be a circular shape, an oval shape, or various other shapes. The non-display area NDA may be disposed adjacent to four sides of the display area DA. The non-display area NDA may form a bezel of the display device 1.

The display area DA may include a plurality of pixels. The pixels may be arranged in a matrix form. Each of the pixels may be rectangular or square in a plan view. However, the disclosure is not limited thereto, and alternatively, each of the pixels may also have a rhombic planar shape having each side inclined with respect to a direction. The pixels may be alternately arranged in a stripe type or a pentile type. In addition, each of the pixels may include one or more light emitting elements which emit light of a specific wavelength band to display a specific color.

The display panel 10 may include a first substrate 100 and a second substrate 200 disposed on the first substrate 100. Although not illustrated, the display panel 10 may further include a sealing member (not illustrated) for bonding the first substrate 100 and the second substrate 200 together.

The first substrate 100 may include a plurality of pixels and may include a light emitting element disposed in each pixel. The first substrate 100 may be a display substrate that provides light for displaying an image. The first substrate 100 may be a rigid substrate including a rigid material such as glass or quartz or may be a flexible substrate including a flexible material such as flexible glass or polyimide.

The second substrate 200 may be placed to face or disposed opposite to the first substrate 100. In an embodiment, for example, the second substrate 200 may be an encapsulation substrate disposed on the first substrate 100 to encapsulate the light emitting elements. The second substrate 200 may prevent the light emitting elements from being damaged by air or moisture. The second substrate 200 may include a transparent plate or a transparent film. In an embodiment, for example, the second substrate 200 may include a glass material or a quartz material.

The first substrate 100 may be disposed over the display area DA and the non-display area NDA and may have a larger area than the second substrate 200 in a plan view. A portion of the first substrate 100 on a first side in the second direction DR2 may not overlap the second substrate 200. In an embodiment, for example, the first substrate 100 may protrude further from a long side of the second substrate 200 on the first side in the second direction DR2, which extends along the first direction DR1 of the second substrate 200, toward the first side in the second direction DR2. The other sides of the first substrate 100 may be aligned with the other sides of the second substrate 200.

The non-display area NDA located at a side of the first substrate 100 in the second direction DR2 and not overlapping the second substrate 200 may include a pad area PA.

The pad area PA may include a first pad area PA1 and a second pad area PA2. The first pad area PA1 and the second pad area PA2 may be areas in which pad electrodes to be described later are disposed and electrically connected to the display panel 10, driving chips DIC to be described later, and a printed circuit board PCB to be described later. That is, the printed circuit board PCB and the driving chips DIC to be described later may be electrically connected to the display panel 10 by the first pad area PA1 and the second pad area PA2, respectively.

The display device 1 may further include the printed circuit board PCB and the driving chips DIC.

The printed circuit board PCB may be attached to the first pad area PA1.

The printed circuit board PCB may have long sides extending in the first direction DR1 and short sides extending in the second direction DR2 and may be electrically connected to a plurality of pad electrodes disposed in the first pad area PA1 by a first anisotropic conductive film ACF1 disposed between the first pad area PA1 and the printed circuit board PCB.

The printed circuit board PCB may include or be made of a rigid material and may be opaque. However, the disclosure is not limited thereto. In some embodiments, the printed circuit board PCB may be a flexible printed circuit film that can be bent.

Although FIG. 1 shows an embodiment where a single printed circuit board PCB is attached to the first pad area PA1 of the display panel 10, the disclosure is not limited thereto. In some embodiments, a plurality of printed circuit boards PCB may be attached to the first pad area PA1 of the display panel 10. In an embodiment, for example, the printed circuit boards PCB may be spaced apart from each other in the first direction DR1 and may be attached to the first pad area PA1.

A plurality of driving chips DIC may be mounted in the second pad area PA2. The driving chips DIC may be arranged along the first direction DR1 in the second pad area PA2 located between the display area DA and the first pad area PA1. The driving chips DIC may be electrically connected to a plurality of pad electrodes disposed in the second pad area PA2 by a second anisotropic conductive film ACF2 disposed between the second pad area PA2 and the driving chips DIC.

The driving chips DIC may be attached to the display panel 10 using a chip on glass (COG) method, a chip on plastic (COP) method, or a chip on film (COF) method. In an embodiment, for example, as illustrated in FIGS. 1 and 2, the driving chips DIC may be directly mounted on the second pad area PA2 of the display panel 10 using the COG method. Although FIGS. 1 and 2 shows an embodiment where the driving chips DIC are directly mounted on the second pad area PA2 included in the non-display area NDA of the display panel 10, the disclosure is not limited thereto. In some embodiments, the driving chips DIC may be mounted on the printed circuit board PCB using the COF method.

Figure 3:
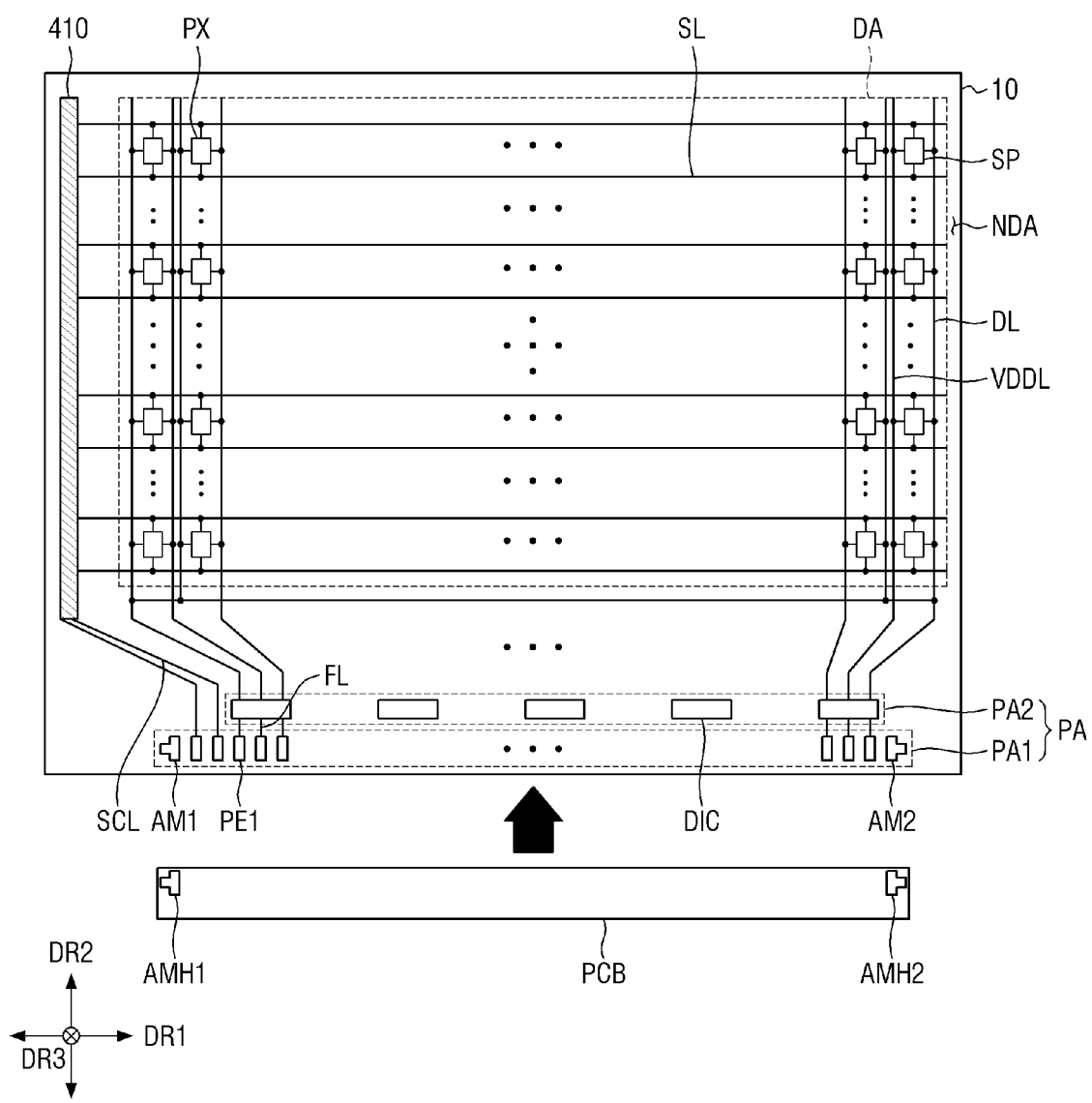
FIGS. 3 and 4 are plan views of a display panel according to an embodiment.
Figure 4:
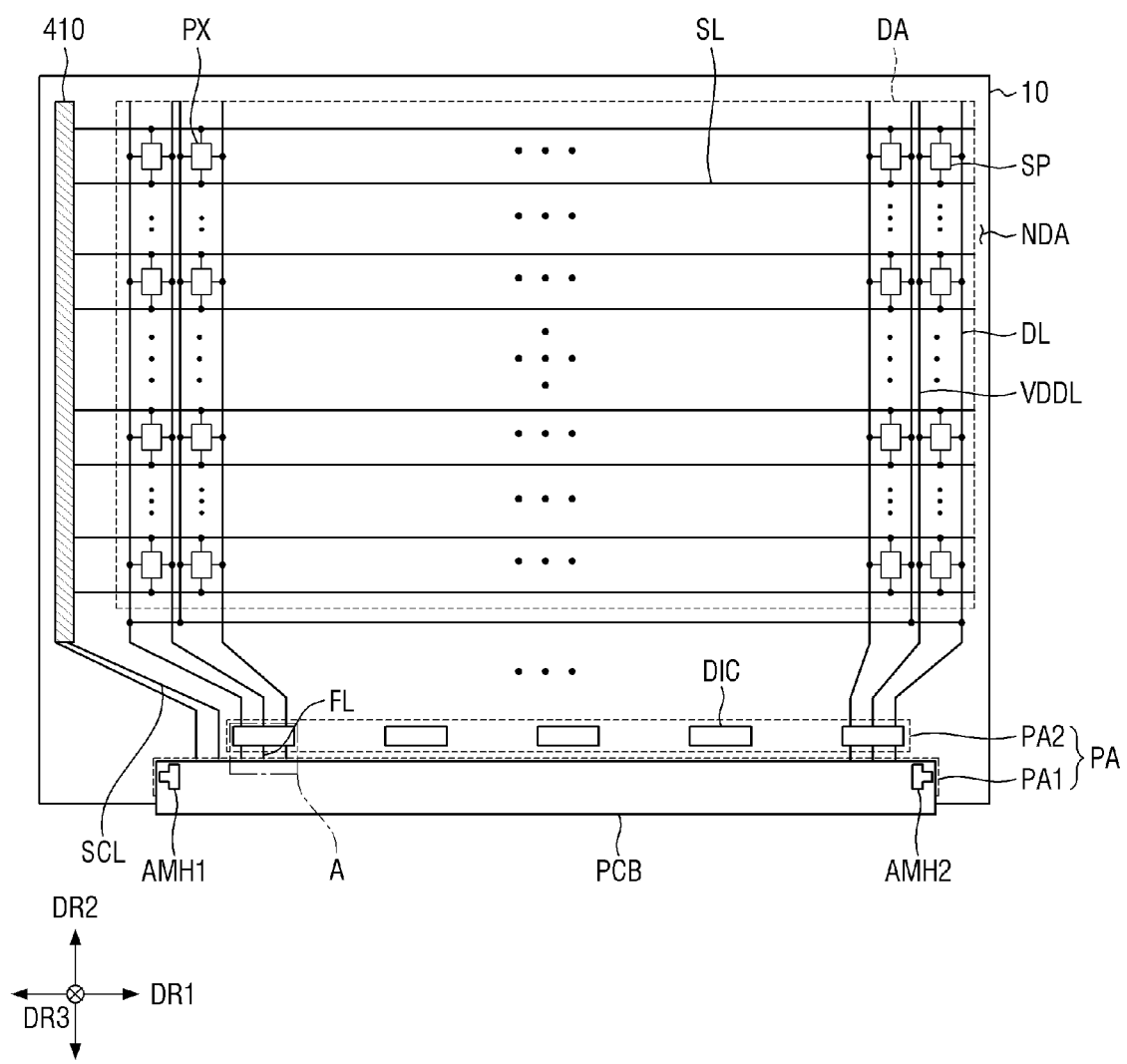
Figure 5:
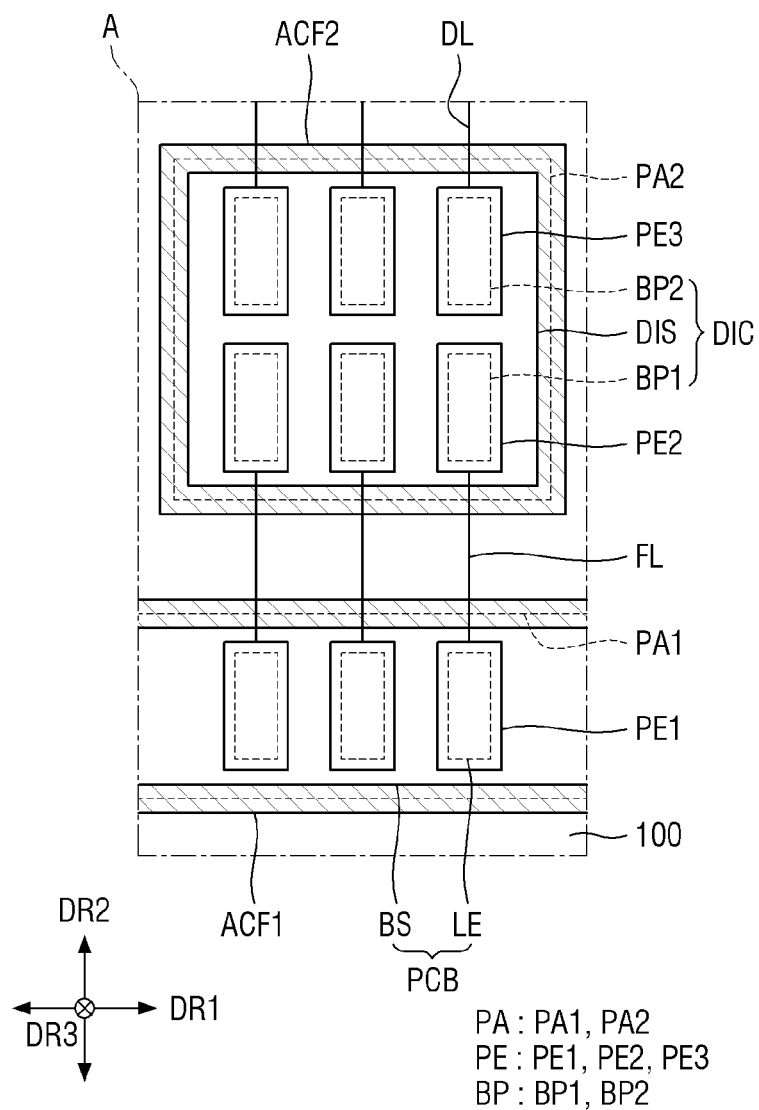
FIG. 5 is an enlarged view of area A of FIG. 4.
Figure 6:
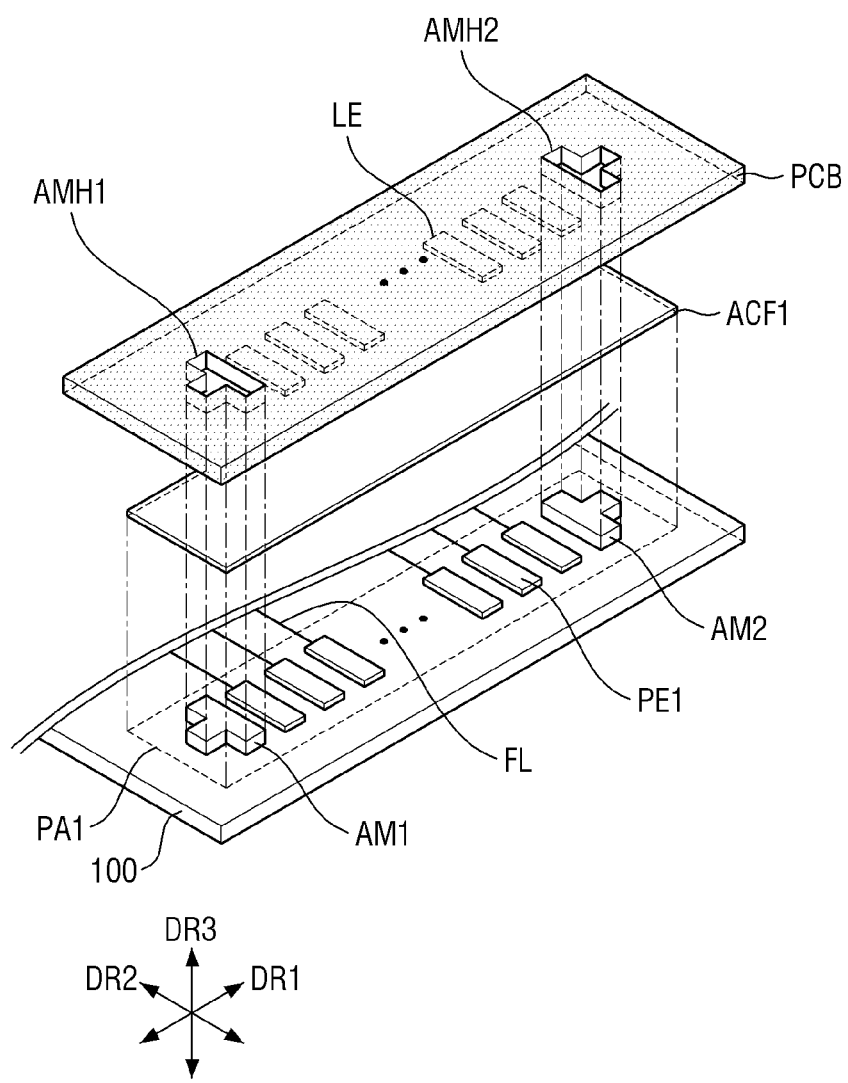
FIG. 6 is a perspective view illustrating a first pad area of the display panel and a printed circuit board attached to the first pad area according to an embodiment.

FIGS. 3 and 4 are plan views of a display panel 10 according to an embodiment. FIG. 5 is an enlarged view of area A of FIG. 4. FIG. 6 is a perspective view illustrating a first pad area PA1 of the display panel 10 and a printed circuit board PCB attached to the first pad area PA1 according to an embodiment.

Specifically, FIG. 3 is a plan view illustrating an embodiment of the display panel in a state before the printed circuit board PCB is attached to the first pad area PA1 of the display panel 10, and FIG. 4 is a plan view illustrating an embodiment of the display panel 10 in a state after the printed circuit board PCB is attached to the first pad area PA1 of the display panel 10.

Referring to FIGS. 3 through 6, not only a plurality of pixels SP, but also scan lines SL, data lines DL and driving voltage lines VDDL connected to the pixels SP may be disposed in a display area DA. The scan lines SL may extend parallel to each other in the first direction DR1, and the data lines DL may extend parallel to each other in the second direction DR2 intersecting the first direction DR1. The driving voltage lines VDDL may extend parallel to each other in the second direction DR2 in the display area DA. The driving voltage lines VDDL extending parallel to each other in the second direction DR2 in the display area DA may be connected to each other in a non-display area NDA.

Each of the pixels SP may be connected to a corresponding one of the scan lines SL, a corresponding one of the data lines DL, and a corresponding one of the driving voltage lines VDDL. In an embodiment, as shown in FIGS. 3 and 4, each of the pixels SP may be connected to two scan lines SL, one data line DL, and one driving voltage line VDDL. However, the disclosure is not limited to this case. In an alternative embodiment, for example, each of the pixels SP may also be connected to three scan lines SL instead of two scan lines SL or one scan line SL instead of two scan line.

A pad area PA in which a plurality of pad electrodes PE are disposed may be disposed or defined on a side of the non-display area NDA in the second direction DR2 as described above. in an embodiment, the pad area PA may be disposed at an edge on the first side in the second direction DR2 and may include the first pad area PA1 to which the printed circuit board PCB is attached and a second pad area PA2 disposed between the display area DA and the first pad area PA1. That is, the first pad area PA1 and the second pad area PA2 may be spaced apart from each other in the second direction DR2.

In an embodiment, as shown in FIG. 5, the pad electrodes PE disposed in the pad area PA may include first pad electrodes PE1, second pad electrodes PE2, and third pad electrodes PE3.

An area in which the first pad electrodes PE1 are disposed is defined as the first pad area PA1, and an area in which the second pad electrodes PE2 and the third pad electrodes PE3 are disposed is defined as the second pad area PA2.

In the first pad area PA1, the first pad electrodes PE1 may be spaced apart from each other along the first direction DR1. In the second pad area PA2, the second pad electrodes PE2 and the third pad electrodes PE3 may be spaced apart from each other along the first direction DR1 to form a plurality of rows. That is, in the second pad area PA2, the second pad electrodes PE2 may be spaced apart from each other along the first direction DR1 to form a first row, and the third pad electrodes PE3 may be spaced apart from each other along the first direction DR1 to form a second row. In such an embodiment, in the second pad area PA2, the second pad electrodes PE2 and the third pad electrodes PE3 may be arranged in two rows in a plan view. However, the disclosure is not limited thereto, and the number and arrangement of the pad electrodes PE are not limited thereto.

As illustrated in FIGS. 3 through 5, at least some of the third pad electrodes PE3 may be respectively connected to the data lines DL extending from the display area DA, and the second pad electrodes PE2 and the first pad electrodes PE1 may be connected to each other through a plurality of connection signal lines FL extending in the second direction DR2.

A scan driver 410 for transmitting scan signals to the scan lines SL may be disposed on a side of the non-display area NDA in the first direction DR1. The scan driver 410 may be electrically connected to driving chips DIC through a plurality of scan control lines SCL. The scan driver 410 may receive a scan control signal from the first pad electrodes PE1 through the scan control lines SCL connected to some of the first pad electrodes PE1 disposed in the first pad area PA1. The scan driver 410 may generate scan signals based on the scan control signal and sequentially output the scan signals to the scan lines SL.

Pixels SP to be supplied with data voltages are selected by the scan signals of the scan driver 410, and the data voltages are supplied to the selected pixels SP. Although FIGS. 3 and 4 shows an embodiment where the scan driver 410 is disposed on a side of the non-display area NDA in the first direction DR1, the disclosure is not limited thereto. In an alternative embodiment, for example, the scan driver 410 may also be disposed on both opposing sides of the non-display area NDA in the first direction DR1.

As illustrated in FIGS. 5 and 6, the printed circuit board PCB may include a base substrate BS (shown in FIG. 12) and a plurality of lead electrodes LE disposed on a surface of the base substrate BS, which faces the display panel 10, and electrically connected to the first pad electrodes PE1. The printed circuit board PCB may be bonded to the first pad area PA1 through a first anisotropic conductive film ACF1. Each of the lead electrodes LE may have, but is not limited to, a substantially rectangular shape in a plan view.

The lead electrodes LE may respectively overlap the first pad electrodes PE1 in a plan view. The lead electrodes LE may be arranged in a shape corresponding to the first pad electrodes PE1 in a plan view. The lead electrodes LE may be arranged to form at least one row and/or at least one column in a plan view. In FIG. 5, the lead electrodes LE may be arranged to form one row extending in the first direction DR1 in the first pad area PA1. However, the number and arrangement of the lead electrodes LE are not limited thereto.

In an embodiment, as shown in FIG. 5, each of the driving chips DIC may include a circuit board DIS, which faces the display panel 10, a plurality of first bump electrodes BP1 disposed on a surface of the circuit board DIS, which faces the display panel 10, and electrically connected to the second pad electrodes PE2, and a plurality of second bump electrodes BP2 disposed on the surface of the circuit board DIS and electrically connected to the third pad electrodes PE3. Each of the driving chips DIC may be bonded to the second pad area PA2 through a second anisotropic conductive film ACF2. Each of the bump electrodes BP may have, but is not limited to, a substantially rectangular shape in a plan view.

The bump electrodes BP may respectively overlap the second pad electrodes PE2 and the third pad electrodes PE3 in a plan view. A plurality of lead electrodes LE may be arranged in a shape corresponding to the first pad electrodes in a plan view. The lead electrodes LE may be arranged to form at least one row and/or at least one column in a plan view. In an embodiment, as shown in FIG. 5, the bump electrodes BP may be arranged to form a plurality of rows extending in the first direction DR1 and spaced apart from each other in the second direction DR2 in the second pad area PA2. However, the number and arrangement of the bump electrodes BP are not limited thereto.

In an embodiment, the pad electrodes PE may be larger than the lead electrodes LE and the bump electrodes BP in a plan view. However, the size relationship between the pad electrodes PE, the lead electrodes LE, and the bump electrodes BP is not limited thereto.

The pad electrodes PE, the bump electrodes BP, the lead electrodes LE, the data lines DL, and the connection signal lines FL may include a conductive material. The conductive material may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The first pad area PA1 may further include a first alignment mark AM1 and a second alignment mark AM2 disposed on opposing sides of the first pad electrodes PE1. That is, the first alignment mark AM1 and the second alignment mark AM2 may be spaced apart from each other in the first direction DR1 with the first pad electrodes PE1 interposed therebetween and may be disposed at opposing edges of the first pad area PA1 in the first direction DR1. The first alignment mark AM1 and the second alignment mark AM2 may protrude more than the first pad electrodes PE1 in the third direction DR3. The first alignment mark AM1 and the second alignment mark AM2 will be described in detail later.

The printed circuit board PCB attached to the first pad area PA1 may further be provided with a first alignment mark hole AMH1 on a side of the lead electrodes LE in the first direction DR1 and a second alignment mark hole AMH2 disposed on another side of the lead electrodes LE in the first direction DR1. The first alignment mark hole AMH1 and the second alignment mark hole AMH2 may have same planar shapes as the first alignment mark AM1 and the second alignment mark AM2, respectively.

When the printed circuit board PCB is attached to the first pad area PA1, the first alignment mark hole AMH1 and the second alignment mark hole AMH2 may respectively overlap the first alignment mark AM1 and the second alignment mark AM2 in the thickness direction and may be physically coupled to the first alignment mark AM1 and the second alignment mark AM2. That is, the first alignment mark AM1 and the second alignment mark AM2 may be inserted from a surface toward the other surface of the printed circuit board PCB and may be physically coupled to the first alignment mark hole AMH1 and the second alignment mark AMH2, respectively. In such an embodiment, the first alignment mark hole AMH1 and the second alignment mark hole AMH2 may respectively surround the first alignment mark AM1 and the second alignment mark AM2 in a plan view, and the first alignment mark AM1 and the second alignment mark AM2 may be accommodated in the first alignment mark hole AMH1 and the second alignment mark hole AMH2, respectively.

The first alignment mark hole AMH1 and the second alignment mark hole AMH2 will be described in detail later.

Figure 7:
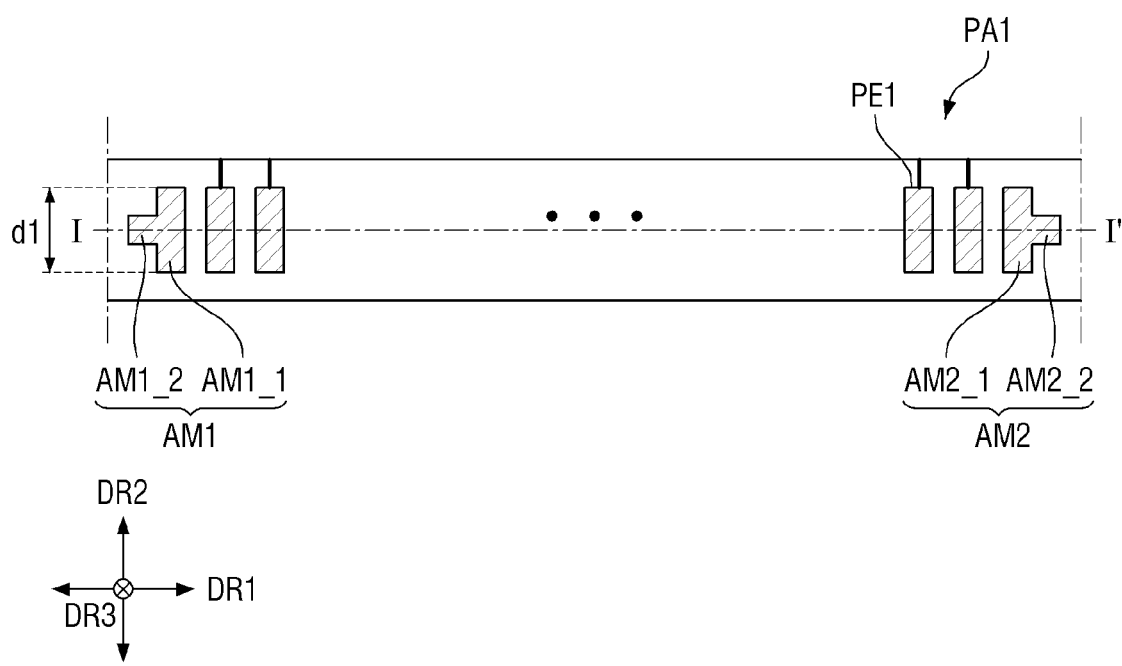
FIG. 7 is a plan view of the first pad area of the display panel according to an embodiment.
Figure 8:
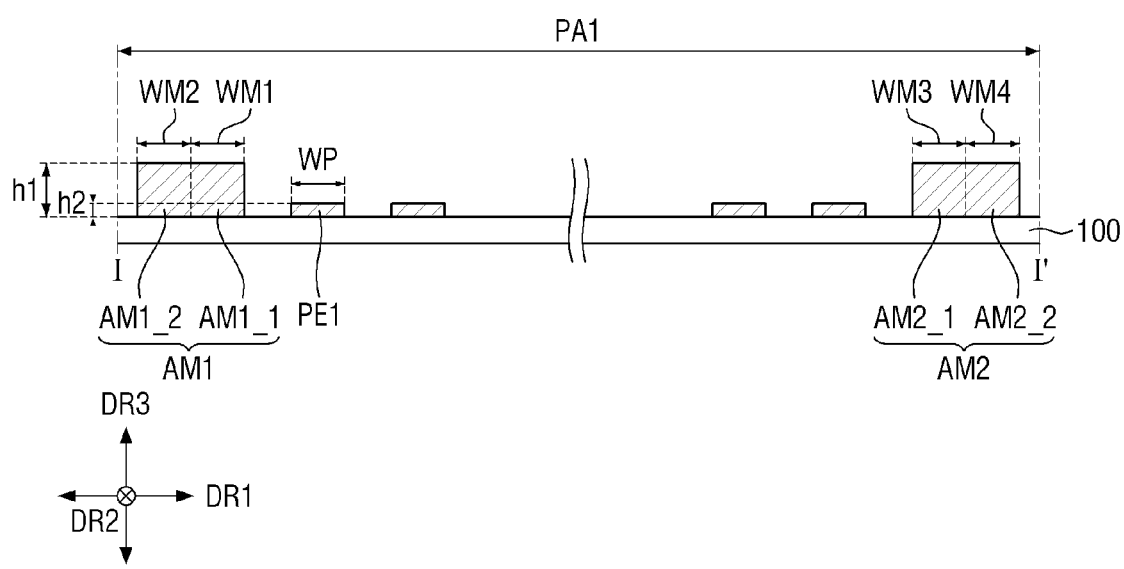
FIG. 8 is a cross-sectional view taken along line I-I' of FIG. 7.
Figure 9:
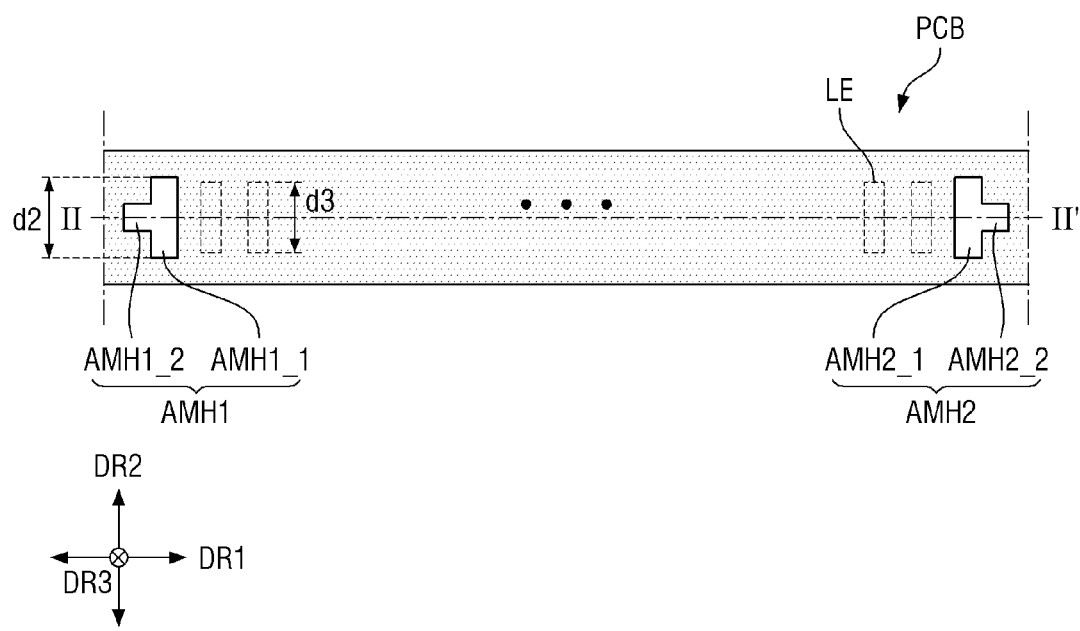
FIG. 9 is a plan view of a printed circuit board according to an embodiment.
Figure 10:
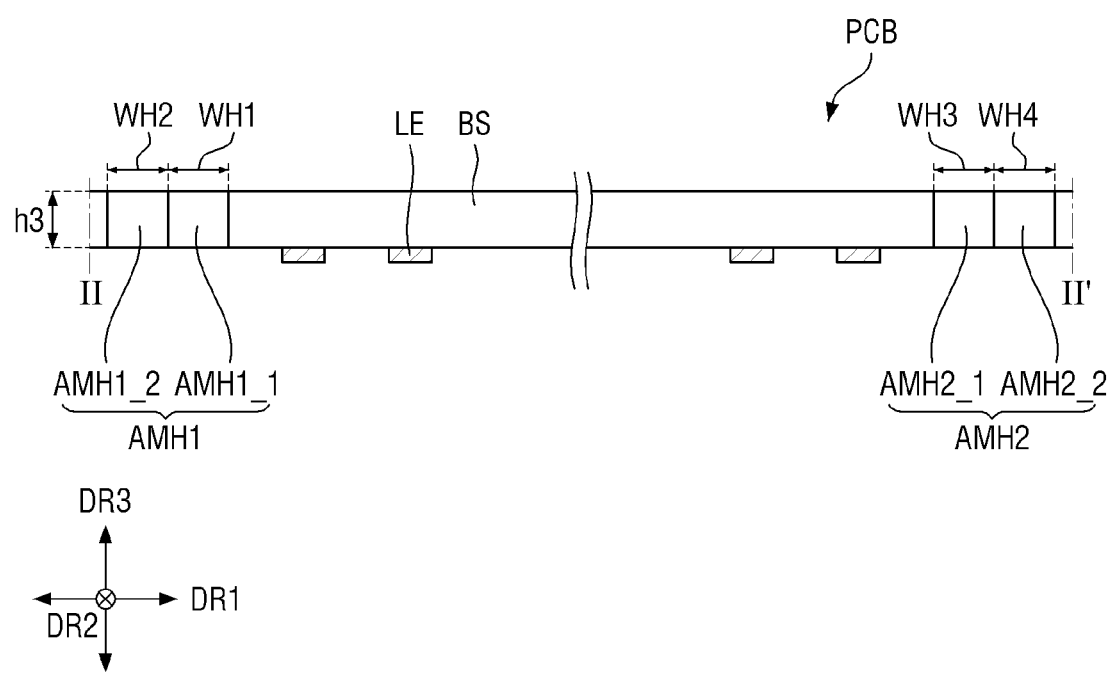
FIG. 10 is a cross-sectional view taken along line II-IF of FIG. 9.
Figure 11:
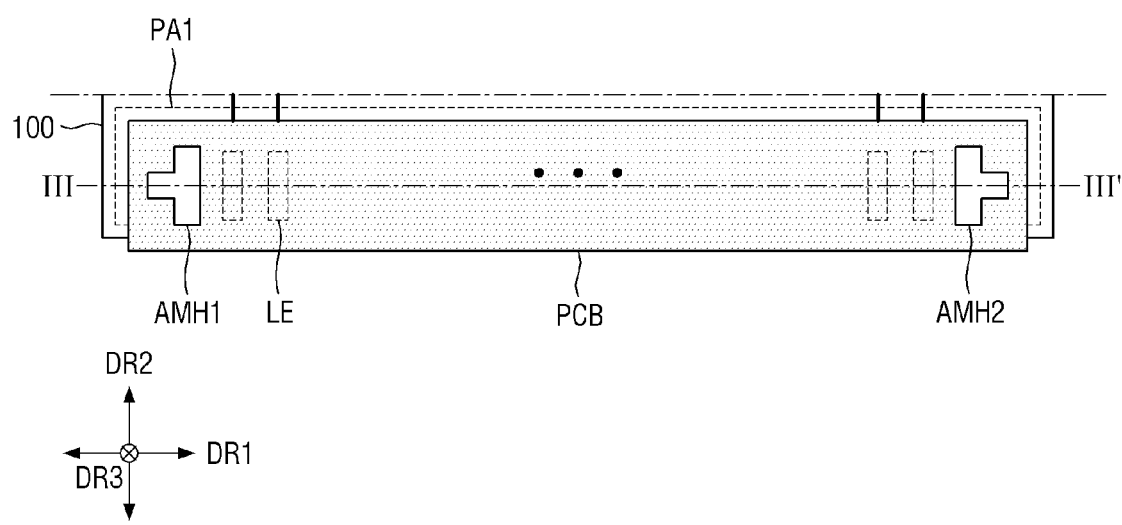
FIG. 11 is a plan view illustrating the first pad area of the display panel and the printed circuit board attached to the first pad area according to an embodiment.
Figure 12:
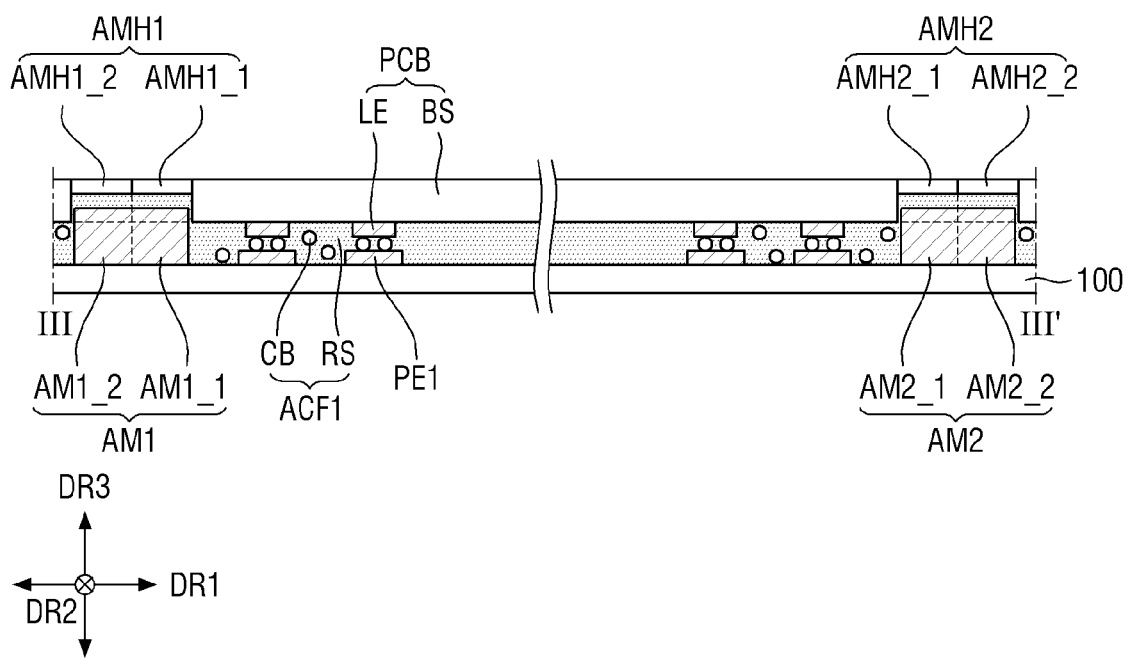
FIG. 12 is a cross-sectional view taken along line of FIG. 11.

FIG. 7 is a plan view of the first pad area PA1 of the display panel 10 according to an embodiment. FIG. 8 is a cross-sectional view taken along line I-I' of FIG. 7. FIG. 9 is a plan view of a printed circuit board PCB according to an embodiment. FIG. 10 is a cross-sectional view taken along line II-II' of FIG. 9. FIG. 11 is a plan view illustrating the first pad area PA1 of the display panel 10 and the printed circuit board PCB attached to the first pad area PA1 according to an embodiment. FIG. 12 is a cross-sectional view taken along line of FIG. 11.

Referring to FIGS. 7 and 8, the first pad area PA1 may include the first pad electrodes PE1 arranged along the first direction DR1, the first alignment mark AM1 disposed on a side of the first pad electrodes PE1 in the first direction DR1 (i.e., one of two opposing sides in the first direction DR1), and the second alignment mark AM2 disposed on an opposing side of the first pad electrodes PE1 in the first direction DR1 (i.e., the other of two opposing sides in the first direction DR1).

The first alignment mark AM1 may include a first portion AM1_1 extending in the second direction DR2 in a plan view and a second portion AM1_2 extending from the middle (or a center portion) of the first portion AM1_1 toward a first side in the first direction DR1. However, the disclosure is not limited thereto. In some embodiments, the second portion AM1_2 of the first alignment mark AM1 may extend from a side or the other side of the first portion AM_1 of the first alignment mark AM1 in the second direction DR2 toward the first side or a second side in the first direction DR1.

The second alignment mark AM2 may have a same shape as the first alignment mark AM1 in a plan view but may be symmetrical to the first alignment mark AM1. That is, the second alignment mark AM2 may include a first portion AM2_1 extending in the second direction DR2 and a second portion AM2_2 extending from the middle of the first portion AM2_1 toward the second side in the first direction DR1. However, the disclosure is not limited thereto. In some embodiments, the second portion AM2_2 of the second alignment mark AM2 may extend from a side or the opposing side of the first portion AM2_1 in the second direction DR2 toward the first side or the second side in the first direction DR1. In some other embodiments, the first alignment mark AM1 and the second alignment mark AM2 may have the same shape in a plan view, and the second portion AM1_2 of the first alignment mark AM1 and the second portion AM2_2 of the second alignment mark AM2 may extend in a same direction as each other. However, the disclosure is not limited thereto. In some embodiments, the shape of the first alignment mark AM1 and the shape of the second alignment mark AM2 may be different from each other.

The first portion AM1_1 of the first alignment mark AM1, the first portion AM2_1 of the second alignment mark AM2, and the first pad electrodes PE1 may have the same length d1 in the second direction DR2 in a plan view. However, the disclosure is not limited thereto. In some embodiments, the first portion AM_1 of the first alignment mark AM1 and the first portion AM2_1 of the second alignment mark AM2 may have a different length from the first pad electrodes PE1 in the second direction DR2 in a plan view. In an embodiment, for example, the first portion AM_1 of the first alignment mark AM1 and the first portion AM2_1 of the second alignment mark AM2 may extend further toward the first side or the second side in the second direction DR2 than the first pad electrodes PE1 in a plan view. In some other embodiments, the first pad electrodes PE1 may extend further toward the first side or the second side in the second direction DR2 than the first portion AM1_1 of the first alignment mark AM1 and the first portion AM2_1 of the second alignment mark AM2 in a plan view.

A width WM1 of the first portion AM1_1 of the first alignment mark AM1 may be equal to a width WM2 of the second portion AM1_2. However, the disclosure is not limited thereto, and alternatively, the width WM1 of the first portion AM1_1 of the first alignment mark AM1 may also be different from the width WM2 of the second portion AM1_2. In an embodiment, for example, the width WM1 of the first portion AM_1 of the first alignment mark AM1 may be greater than the width WM2 of the second portion AM1_2, or the width WM2 of the second portion AM1_2 may be greater than the width WM1 of the first portion AM1_1.

A width WM3 of the first portion AM2_1 of the second alignment mark AM2 may be equal to a width WM4 of the second portion AM2_2. However, the disclosure is not limited thereto. Like the first alignment mark AM1, the width WM3 of the first portion AM2_1 of the second alignment mark AM2 may also be different from the width WM4 of the second portion AM2_2. Each of the width WM1 of the first portion AM1_1 of the first alignment mark AM1, the width WM2 of the second portion AM1_2 of the first alignment mark AM1, the width WM3 of the first portion AM2_1 of the second alignment mark AM2, and the width WM4 of the second portion AM2_2 of the second alignment mark AM2 may be equal to a width WP of each of the first pad electrodes PE1. However, the disclosure is not limited thereto, and at least one selected from the width WM1 of the first portion AM1_1 of the first alignment mark AM1, the width WM2 of the second portion AM1_2 of the first alignment mark AM1, the width WM3 of the first portion AM2_1 of the second alignment mark AM2, and the width WM4 of the second portion AM2_2 of the second alignment mark AM2 may also be different from the width WP of each of the first pad electrodes PE1.

In an embodiment, the first alignment mark AM1 and the second alignment mark AM2 may protrude more than the first pad electrodes PE1 in the third direction DR3. That is, a thickness h1 of the first alignment mark AM1 and the second alignment mark AM2 in the third direction DR3 may be greater than a thickness h2 of the first pad electrodes PE1 in the third direction DR3. In an embodiment, the thickness h2 of the first pad electrodes PE1 may be in a range of ¼ to ⅓ of the thickness h1 of the first alignment mark AM1 and the second alignment mark AM2. However, the thickness h1 of the first alignment mark AM1 and the second alignment mark AM2 is not limited to the above numerical range.

Since the first alignment mark AM1 and the second alignment mark AM2 are thicker than the first pad electrodes PE', the first alignment mark AM1 and the second alignment mark AM2 can be physically coupled to the first alignment mark hole AMH1 and the second alignment mark hole AMH2 included in the printed circuit board PCB.

The first alignment mark AM1 and the second alignment mark AM2 may include or be made of a same conductive material as the first pad electrodes PE1 described above. However, the disclosure is not limited thereto. In some embodiments, the first alignment mark AM1 and the second alignment mark AM2 may include or be made of a different material from the first pad electrodes PE1.

Referring to FIGS. 9 and 10, the printed circuit board PCB may include the lead electrodes LE arranged along the first direction DR1, and the first alignment mark hole AMH1 may be defined through the printed circuit board PBC in an area at a side of the lead electrodes LE in the first direction DR1, and the second alignment mark hole AMH2 may be defined through the printed circuit board PBC in an area at the other side of the lead electrodes LE in the first direction DR1.

As described above, the first alignment mark hole AMH1 may have a same shape as the first alignment mark AM1. in an embodiment, like the first alignment mark AM1, the first alignment mark hole AMH1 may include a first portion AMH1_1 extending in the second direction DR2 in a plan view and a second portion AMH1_2 extending from the middle of the first portion AMH1_1 toward the first side in the first direction DR1. However, the disclosure is not limited thereto. In some embodiments, the second portion AMH1_2 of the first alignment mark hole AMH1 may extend in the first direction DR1 from a side or the other side of the first portion AMH1_1 of the first alignment mark hole AMH1 in the second direction DR2.

The second alignment mark hole AMH2 may have a same shape as the first alignment mark hole AMH1 in a plan view, but may be symmetrical to the first alignment mark hole AMH1. That is, the second alignment mark hole AMH2 may include a first portion AMH2_1 extending in the second direction DR2 and a second portion AMH2_2 extending from the middle of the first portion AMH2_1 toward the second side in the first direction DR1. However, the disclosure is not limited thereto. In some embodiments, the second portion AMH2_2 of the second alignment mark hole AMH2 may extend in the first direction DR1 from a side or the other side of the first portion AMH2_1 of the second alignment mark hole AMH2 in the second direction DR2. In some other embodiments, the first alignment mark hole AMH1 and the second alignment mark hole AMH2 may have a same shape as each other in a plan view, and the second portion AMH1_2 of the first alignment mark hole AMH1 and the second portion AMH2_2 of the second alignment mark hole AMH2 may extend in a same direction as each other.

Since the first alignment mark AM1 and the second alignment mark AM2 are disposed (e.g., accommodated or inserted) in the first alignment mark hole AMH1 and the second alignment mark hole AMH2, respectively, a length d2 of the first portion AMH1_1 of the first alignment mark hole AMH1 and the first portion AMH2_1 of the second alignment mark hole AMH2 in the second direction DR2 may be greater than the length d1 of the first portion AM1_1 of the first alignment mark AM1 and the first portion AM2_1 of the second alignment mark AM2 in the second direction DR2 in FIG. 7.

In an embodiment, as described above with reference to FIG. 5, the first pad electrodes PE1 have a larger area than the lead electrodes LE in a plan view. Therefore, the length d2 of the first portion AMH1_1 of the first alignment mark hole AMH1 and the first portion AMH2_1 of the second alignment mark hole AMH2 in the second direction DR2 in a plan view may be greater than a length d3 of the lead electrodes LE in the second direction DR2 in a plan view. However, the disclosure is not limited thereto. In some embodiments, where the first pad electrodes PE1 and the lead electrodes LE have a same area as each other in a plan view, the length d2 of the first portion AMH1_1 of the first alignment mark hole AMH1 and the first portion AMH2_1 of the second alignment mark hole AMH2 in the second direction DR2 in a plan view may be equal to the length d3 of the lead electrodes LE in the second direction DR2 in a plan view.

A thickness (or depth) h3, in the third direction DR3, of the first alignment mark hole AMH1 and the second alignment mark hole AMH2, which are defined completely through the base substrate BS of the printed circuit board PCB in the third direction DR3, that is, in the thickness direction, may be greater than the thickness h1 of the first alignment mark AM1 and the second alignment mark AM2 in the third direction DR3 in FIG. 8. Since the thickness h3 of the first alignment mark hole AMH1 and the second alignment mark hole AMH2 is greater than the thickness h1 of the first alignment mark AM1 and the second alignment mark AM2 in the third direction DR3, when the first alignment mark AM1 and the second alignment mark AM2 are physically coupled to the first alignment mark hole AMH1 and the second alignment mark hole AMH2, respectively, the first alignment mark AM1 and the second alignment mark AM2 may be prevented from completely passing through the first alignment mark hole AMH1 and the second alignment mark hole AMH2 and thus being exposed to the outside. However, the disclosure is not limited thereto. In some embodiments, the thickness h3 of the first alignment mark hole AMH1 and the second alignment mark hole AMH2 in the third direction DR3 may be equal to the thickness h1 of the first alignment mark AM1 and the second alignment mark AM2 in the third direction DR3.

A width WH1 of the first portion AMH1_1 of the first alignment mark hole AMH1 in the first direction DR1 may be equal to a width WH2 of the second portion AMH1_2 in the first direction DR1. However, the disclosure is not limited thereto, and the width WH1 of the first portion AMH1_1 of the first alignment mark hole AMH1 and the width WH2 of the second portion AMH1_2 may vary according to the width WM1 of the first portion AM1_1 of the first alignment mark AM1 and the width WM2 of the second portion AM1_2. In an embodiment, for example, where the width WM1 of the first portion AM_1 of the first alignment mark AM1 is greater than the width WM2 of the second portion AM1_2 of the first alignment mark AM1, the width WH1 of the first portion AMH1_1 of the first alignment mark hole AMH1 may be greater than the width WH2 of the second portion AMH1_2 of the first alignment mark hole AMH1.

A width WH3 of the first portion AMH2_1 of the second alignment mark hole AMH2 may be equal to a width WH4 of the second portion AMH2_2. However, the disclosure is not limited thereto. Like the first alignment mark hole AMH1, the width WH3 of the first portion AMH2_1 of the second alignment mark hole AMH2 and the width WH4 of the second portion AMH2_2 of the second alignment mark hole AMH2 may vary according to the width WM3 of the first portion AM2_1 of the second alignment mark AM2 and the width WM4 of the second portion AM2_2 of the second alignment mark AM2, respectively.

FIGS. 11 and 12 illustrate the printed circuit board PCB attached to the pad area PA of the first substrate 100 in a case where the first pad electrodes PE1 disposed in the first pad area PA1 of the first substrate 100 are completely aligned with the lead electrodes LE of the printed circuit board PCB.

Referring to FIGS. 11 and 12, in the first pad area PA1, the printed circuit board PCB and the first substrate 100 may be placed to face each other with the first anisotropic conductive film ACF1 interposed therebetween. The first anisotropic conductive film ACF1 may include an adhesive member RS and a plurality of conductive balls CB disposed (e.g., scattered) in the adhesive member RS.

In the first pad area PA1, the printed circuit board PCB may be attached onto the first substrate 100 by the adhesive member RS and may be electrically connected to the first substrate 100 by the conductive balls CB interposed between the first pad electrodes PE1 and the lead electrodes LE. That is, the first pad electrodes PE1 and the lead electrodes LE may be placed to face each other in a cross section. In an embodiment, for example, the first pad electrodes PE1 may be disposed on an upper surface of the first substrate 100, and the lead electrodes LE may be disposed on a lower surface of the base substrate BS of the printed circuit board PCB which faces the upper surface of the first substrate 100.

The adhesive member RS may be interposed between the base substrate BS of the printed circuit board PCB and the display panel 10. The adhesive member RS may include or be made of an insulating adhesive material. The adhesive member RS may include a thermosetting resin, an ultraviolet curing resin, or a thermoplastic resin. In an embodiment, for example, the adhesive member RS may include styrene butadiene resin, polyvinyl butylene resin, epoxy resin, polyurethane resin, acrylic resin, or the like. The conductive balls CB may include a conductive material, for example, a metal.

The conductive balls CB may have a fine size and may be scattered in the adhesive member RS. In an embodiment, for example, the conductive balls CB may have a fine size in a range of about 3 micrometers (μm) to about 15 μm in diameter and may include polymer particles and a metal coating layer such as Au, Ni or Pd coating the polymer particles. However, the disclosure is not limited thereto, and the conductive balls CB may also be nanowires including or made of a conductive material or may be a conductive paste.

The adhesive member RS may include a first adhesive region, a second adhesive region, and a third adhesive region. In an embodiment, as illustrated in FIG. 12, a plurality of first adhesive regions and a plurality of second adhesive regions may be alternately disposed, and a third adhesive region may be disposed between the second adhesive regions.

Each of the first adhesive regions may be a region in which at least a portion of a first pad electrode PE1 and at least a portion of a lead electrode LE overlap each other in the thickness direction, that is, in the third direction DR3. In an embodiment, as shown in FIG. 12, the width of the first pad electrodes PE1 may be greater than the width of the lead electrodes LE. However, the disclosure is not limited thereto. In some embodiments, the width of the first pad electrodes PE1 may be equal to or smaller than the width of the lead electrodes LE.

Each of the second adhesive regions may be a region in which a first pad electrode PE1 and a lead electrode LE do not overlap each other in the thickness direction. Each of the second adhesive regions may be a region between the first pad electrodes PE1 and/or between the lead electrodes LE. Each of the second adhesive regions may be a region between the first adhesive regions.

The third adhesive regions may be regions in which the first alignment mark AM1 and the second alignment mark AM2 overlap the first alignment mark hole AMH1 and the second alignment mark hole AMH2, respectively.

In the first adhesive regions, some of the conductive balls CB may be interposed between the first pad electrodes PE1 and the lead electrodes LE and may contact the first pad electrodes PE1 and the lead electrodes LE to electrically connect to each other. In the second adhesive regions, other ones of the conductive balls CB may be scattered in spaces between the first pad electrodes PE1 and/or between the lead electrodes LE.

In the third adhesive regions, the first alignment mark AM1 and the second alignment mark AM2 may be respectively physically coupled to the first alignment mark hole AMH1 and the second alignment mark hole AMH2 with the adhesive member RS interposed therebetween. That is, the first portion AM1_1 and the second portion AM1_2 of the first alignment mark AM1 may be partially accommodated in and physically coupled to the first portion AMH1_1 and the second portion AMH1_2 of the first alignment mark hole AMH1, respectively.

In an embodiment, when the printed circuit board PCB is attached to the first pad area PA1 of the first substrate 100, the first alignment mark AM1 protruding more than the first pad electrodes PE1 in the third direction DR3 may be accommodated in the first alignment mark hole AMH1 overlapping the first alignment mark AM1 in the thickness direction. In such an embodiment, the first portion AM1_1 of the first alignment mark AM1 may be accommodated in the first portion AMH1_1 of the first alignment mark hole AMH1, and the second portion AM1_2 of the first alignment mark AM1 may be accommodated in the second portion AMH1_2 of the first alignment mark hole AMH1.

At least a portion of side surfaces of the first portion AM1_1 of the first alignment mark AM1 may overlap at least a portion of inner surfaces of the first portion AMH1_1 of the first alignment mark hole AMH1 in the second direction DR2. That is, at least a portion of the side surfaces of the first portion AM1_1 of the first alignment mark AM1 may face at least a portion of the inner surfaces of the first portion AMH1_1 of the first alignment mark hole AMH1 in the second direction DR2 with the adhesive member RS interposed between them.

Likewise, at least a portion of side surfaces of the second portion AM1_2 of the first alignment mark AM1 may face at least a portion of inner surfaces of the second portion AMH1_2 of the first alignment mark hole AMH1 in the second direction DR2 with the adhesive member RS interposed between them. The adhesive member RS may directly contact side surfaces of the first alignment mark AM1 which do not overlap the inner surfaces of the first alignment mark hole AMH1.

Accordingly, in such an embodiment, a coupling force between the first alignment mark AM1 and the first alignment mark hole AMH1 may be improved by the adhesive member RS located between the first alignment mark AM1 and the first alignment mark hole AMH1.

In such an embodiment, the adhesive member RS may cover an upper surface of the first alignment mark AM1 and fill at least a portion of the first alignment mark hole AMH1. Therefore, the adhesive member RS located on the upper surface of the first alignment mark AM1 may be exposed by the first alignment mark hole AMH1 in a plan view. However, the disclosure is not limited thereto. In some embodiments, the adhesive member RS may fill the entire space in the first alignment mark hole AMH1 except for the space in which the first alignment mark AM1 is accommodated.

In such an embodiment, the features of the second alignment mark AM2 and the second alignment mark hole AMH2 are substantially the same as those of the first alignment mark AM1 and the first alignment mark hole AMH1 described above, and any repetitive detailed description thereof will be omitted.

The density of the conductive balls CB in the first adhesive regions may be greater than the density of the conductive balls CB in the second adhesive regions. The density of the conductive balls CB may be the number of the conductive balls CB disposed per unit area in the first adhesive regions or the second adhesive regions. In other words, the density of the conductive balls CB disposed on the first pad electrodes PE1 and/or the lead electrodes LE may be greater than the density of the conductive balls CB disposed in the spaces between the first pad electrodes PE1 and/or the lead electrodes LE. This difference in the density of the conductive balls CB may be due to the alignment of the conductive balls CB by an electric field before the adhesive member RS is cured. In an alternative embodiment, although not illustrated in FIG. 12, the conductive balls CB may also be disposed only in the first adhesive regions and may not be disposed in the second adhesive regions.

In an embodiment, as shown in FIG. 12, the conductive balls CB are not disposed in the third adhesive regions, but not being limited thereto. Alternatively, the conductive balls CB may also be disposed in the third adhesive regions. However, the density of the conductive balls CB in the third adhesive regions may be less than the density of the conductive balls CB in the first adhesive regions. In such an embodiment, the conductive balls CB may be scattered in the adhesive member RM located on the upper surface of the first alignment mark AM1 and between the first alignment mark AM1 and the first alignment mark hole AMH1.

The adhesive member RS may have different thicknesses in the first adhesive regions, the second adhesive regions, and the third adhesive regions. In an embodiment, the thickness of the adhesive member RS located in the second adhesive regions may be greater than the thickness of the adhesive member RS located in the first adhesive regions and the third adhesive regions, and the thickness of the adhesive member RS located in the first adhesive regions may be greater than the thickness of the adhesive member RS located in the third adhesive regions.

In an embodiment, the thickness of the adhesive member RS located between the side surfaces of the first alignment mark AM1 and the inner surfaces of the first alignment mark hole AMH1 and between side surfaces of the second alignment mark AM2 and inner surfaces of the second alignment mark hole AMH2 may be smaller than the thickness of the adhesive member RS located on the upper surfaces of the first alignment mark AM1 and the second alignment mark AM2.

Such a difference in the thickness of the adhesive member RS located in the first adhesive regions, the second adhesive regions, and the third adhesive regions may be due to the coupling of the printed circuit board PCB to the elements included in the first pad area PA1 of the first substrate 100.

As described above, the display device 1 according to an embodiment includes the first and second alignment marks AM1 and AM2 located at opposing sides of the first pad area PA1 and the first and second alignment mark holes AMH1 and AMH2 located in the printed circuit board PCB and physically coupled to the first and second alignment marks AM1 and AM2, respectively. Accordingly, the rigid printed circuit board PCB can be easily bonded to the first pad area PA1 of the display panel 10.

In such an embodiment, since the first alignment mark AM1 and the second alignment mark AM2 are physically coupled to the first alignment mark hole AMH1 and the second alignment mark hole AMH2, respectively, a bonding force at opposing edges of the printed circuit board PCB and the display panel 10 may be improved. Accordingly, when the printed circuit board PCB is bonded to the display panel 10, it is possible to prevent misalignment at opposing edges of the printed circuit board PCB due to a difference in thermal expansion coefficient between the display panel 10 and the printed circuit board PCB, and it is also possible to prevent detachment of the printed circuit board PCB from the display panel 10 after bonding.

Hereinafter, alternative embodiments of the display device will be described. In the following embodiments, the same elements as those of the above-described embodiment will be indicated by the same reference numerals, and any repetitive detailed description thereof will be omitted simplified, and differences will be mainly described.

Figure 13:
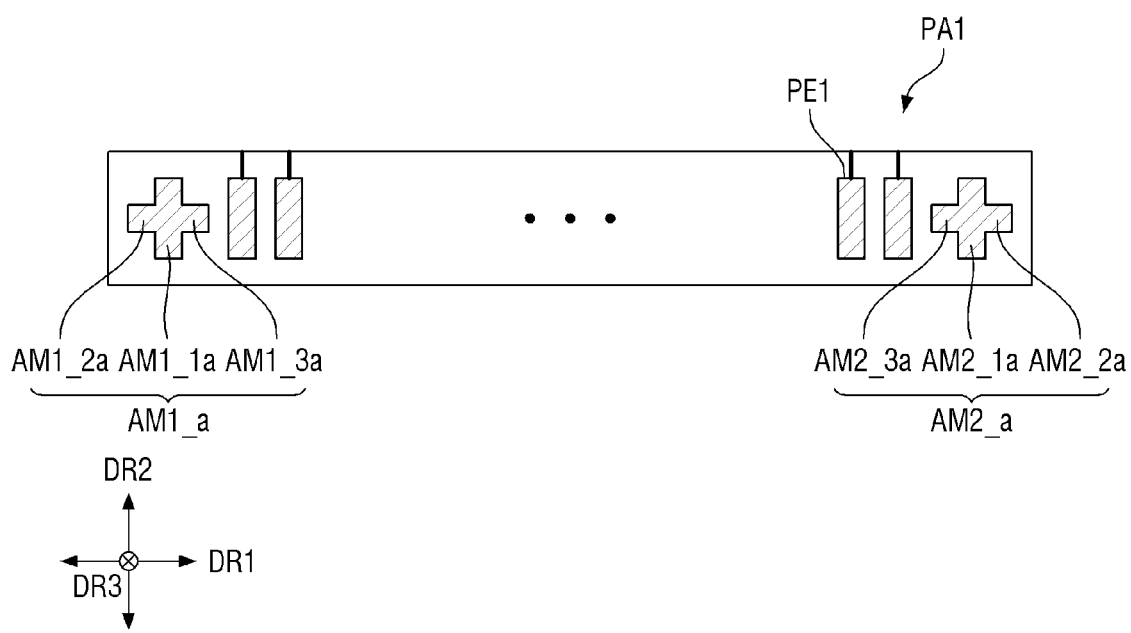
FIG. 13 is a plan view of a first pad area of a display panel according to an embodiment.
Figure 14:
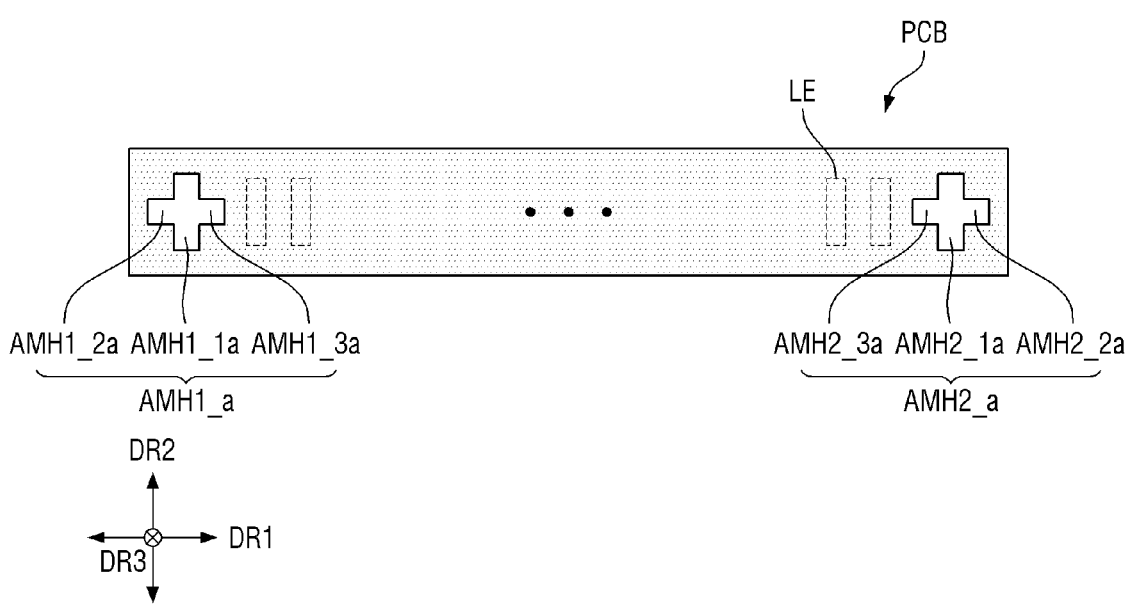
FIG. 14 is a plan view of a printed circuit board according to an embodiment.

FIG. 13 is a plan view of a first pad area of a display panel according to an embodiment. FIG. 14 is a plan view of a printed circuit board PCB according to an embodiment.

The embodiment of FIG. 13 is substantially the same as the embodiment of FIG. 7 except for the planar shapes of a first alignment mark AM1_a and a second alignment mark AM2_a.

Referring to FIG. 13, in an embodiment, first pad electrodes PE1 may be arranged along the first direction DR1, and the first alignment mark AM1_a disposed on a side of the first pad electrodes PE1 in the first direction DR1 and the second alignment mark AM2_a disposed on the opposing side of the first pad electrodes PE1 in the first direction DR1 may have a substantially cross shape (or a cross-like shape) in a plan view.

The first alignment mark AM1_a shown in FIG. 13 is substantially the same as the first alignment mark AM1 illustrated in FIG. 7 except that the first alignment mark AM1_a further includes a third portion AM1_3a extending toward the second side in the first direction DR1.

In such an embodiment, the first alignment mark AM1_a may include a first portion AM1_1a extending in the second direction DR2 in a plan view, a second portion AM1_2a extending from the middle of the first portion AM1_1a toward the first side in the first direction DR1, and the third portion AM1_3a extending from the middle of the first portion AM1_1a toward the second side in the first direction DR1. That is, the first alignment mark AM1_a including the second portion AM1_2a and the third portion AM1_3a symmetrically extending from the first portion AM1_1a toward the first side and the second side in the first direction DR1, respectively, may have a cross shape in a plan view.

However, the disclosure is not limited thereto. In some embodiments, the second portion AM1_2a of the first alignment mark AM1_a may extend from a side or the other side of the first portion AM1_1a in the second direction DR2 toward the first side or the second side in the first direction DR1, and the third portion AM1_3a of the first alignment mark AM1_a may also extend from a side or the other side of the first portion AM1_1a in the second direction DR2 toward the first side or the second side in the first direction DR1.

The second alignment mark AM2_a may have a same shape as the first alignment mark AM1_a in a plan view and may be disposed on the other side of the first pad electrodes PE1 in the first direction DR1 to be symmetrical to the first alignment mark AM1_a. That is, like the first alignment mark AM1_a, the second alignment mark AM2_a including a second portion AM2_2a and a third portion AM2_3a symmetrically extending from a first portion AM2_1a toward the second side and the first side in the first direction DR1, respectively, may have a cross shape in a plan view.

However, the disclosure is not limited thereto. In some embodiments, the first alignment mark AM1_a and the second alignment mark AM2_a may have different shapes from each other in a plan view. In an embodiment, for example, the planar shapes of the first alignment mark AM1_a and the second alignment mark AM2_a may vary according to the positions and directions in which the second portion AM1_2a and the third portion AM1_3a of the first alignment mark AM1_a and the second portion AM2_2a and the third portion AM2_3a of the second alignment mark AM2_a extend.

The embodiment of FIG. 14 is substantially the same as the embodiment of FIG. 9 except for the planar shapes of a first alignment mark hole AMH1_a and a second alignment mark hole AMH2_a.

In an embodiment, the printed circuit board PCB may include lead electrodes LE arranged along the first direction DR1. The first alignment mark hole AMH1_a disposed on a side of the lead electrodes LE in the first direction DR1 and the second alignment mark hole AMH2_a disposed on the other side of the lead electrodes LE in the first direction DR1 may have a same planar shape as the first alignment mark AM1_a and the second alignment mark AM2_a illustrated in FIG. 13. That is, the first alignment mark AM1_a and the second alignment mark AM2_a may have a substantially cross shape in a plan view.

That is, the first alignment mark hole AMH1_a may include a first portion AMH1_1a extending in the second direction DR2 in a plan view and a second portion AMH1_2a and a third portion AMH1_3a extending from the middle of the first portion AMH1_1a toward the first side and the second side in the first direction DR1, respectively.

In such an embodiment, like the first alignment mark hole AMH1_a, the second alignment mark hole AMH2_a may include a first portion AMH2_1a extending in the second direction DR2 in a plan view and a second portion AMH2_2a and a third portion AMH2_3a extending from the middle of the first portion AMH2_1a toward the second side and the first side in the first direction DR1, respectively.

As illustrated in FIGS. 13 and 14, the first alignment mark hole AMH1_a and the second alignment mark hole AMH2_a may have various shapes corresponding to those of the first alignment mark AM1_a and the second alignment mark AM2_a so that they can be physically coupled to the first alignment mark AM1_a and the second alignment mark AM2_a and can accommodate the first alignment mark AM1_a and the second alignment mark AM2_a, respectively.

Figure 15:
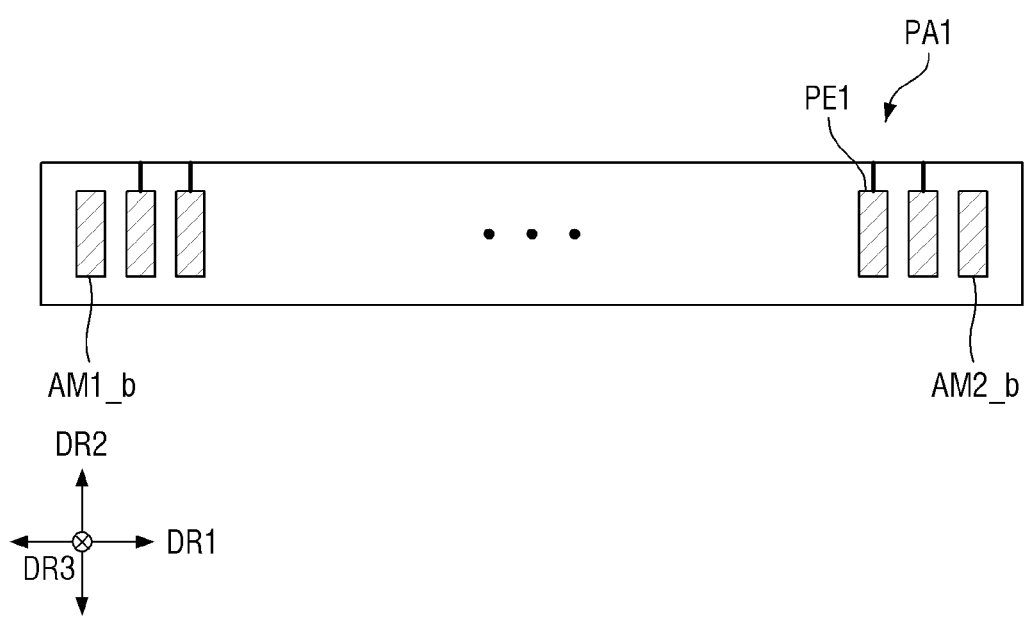
FIG. 15 is a plan view of a first pad area of a display panel according to an embodiment.

FIG. 15 is a plan view of a first pad area PA1 of a display panel 10 according to an embodiment.

The embodiment of FIG. 15 is substantially the same as the embodiment of FIG. 7 except for the planar shapes of a first alignment mark AM1_b and a second alignment mark AM2_b.

Referring to FIG. 15, in an embodiment, first pad electrodes PE1 arranged along the first direction DR1 may have a same planar shape as the first alignment mark AM1_b disposed on a side of the first pad electrodes PE1 in the first direction DR1 and the second alignment mark AM2_b disposed on the other side of the first pad electrodes PE1 in the first direction DR1.

In such an embodiment, the first alignment mark AM1_b and the second alignment mark AM2_b may have a substantially rectangular shape in a plan view, that is, may have short sides extending in the first direction DR1 and long sides extending in the second direction DR2.

In such an embodiment, the first alignment mark AM1_b and the second alignment mark AM2_b may have a same size as the first pad electrodes PE1 in a plan view. In other words, the short sides in the first direction DR1 and the long sides in the second direction DR2 of the first alignment mark AM1_b and the second alignment mark AM2_b may have the same lengths as short sides and long sides of the first pad electrodes PE1, respectively. However, the disclosure is not limited thereto. In some embodiments, the planar size of the first alignment mark AM1_b and the second alignment mark AM2_b may be different from the planar size of the first pad electrodes PE1.

As described above with reference to FIGS. 6 through 12, in the embodiments illustrated in FIGS. 13 through 15, a printed circuit board PCB can be easily bonded to the first pad area PA1 of the display panel 10 by alignment marks and alignment mark holes physically coupled to the alignment marks.

Figure 16:
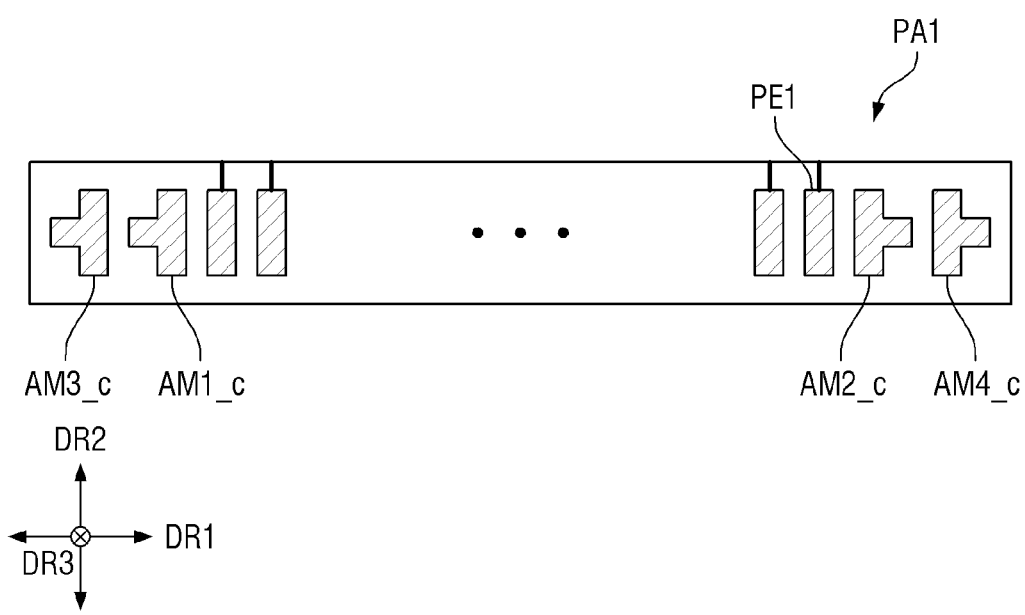
FIG. 16 is a plan view of a first pad area of a display panel according to an embodiment.

FIG. 16 is a plan view of a first pad area PA1 of a display panel according to an embodiment.

The embodiment of FIG. 16 is substantially the same as the embodiment of FIG. 7 except that a plurality of alignment marks are disposed on both sides of the first pad area PA1.

In such an embodiment, the first pad area PA1 may include first pad electrodes PE1, a first alignment mark AM1_c disposed on a side of the first pad electrodes PE1 in the first direction DR1 and a second alignment mark AM2_c disposed on the other side of the first pad electrodes PE1 in the first direction DR1 and may further include a third alignment mark AM3_c and a fourth alignment mark AM4_c respectively disposed on a side of the first alignment mark AM1_c in the first direction DR1 and on a side of the second alignment mark AM2_c in the first direction DR1. That is, a plurality of alignment marks may be disposed on each of both sides of the first pad area PA1.

The first alignment mark AM1_c may be symmetrical to the second alignment mark AM2_c in the first direction DR1 with the first pad electrodes PE1 interposed between them. The third alignment mark AM3_c may be symmetrical to the fourth alignment mark AM4_c in the first direction DR1 with the first pad electrodes PE1, the first alignment mark AM1_c, and the second alignment mark AM2_c interposed between them.

In such an embodiment, the first alignment mark AM1_c, the second alignment mark AM2_c, the third alignment mark AM3_c, and the fourth alignment mark AM4_c may have a same planar shape as the first alignment mark AM1 illustrated in FIG. 7.

The first alignment mark AM1_c and the third alignment mark AM3_c may be arranged in the same direction on a side of the first pad electrodes PE1 in the first direction DR1, and the second alignment mark AM2_c and the fourth alignment mark AM4_c may be arranged in a same direction on the other side of the first pad electrodes PE1 in the first direction DR1. However, the disclosure is not limited thereto. In some embodiments, the arrangement directions of the first alignment mark AM1_c and the third alignment mark AM3_c may be different from each other, and of the arrangement directions of the second alignment mark AM2_c and the fourth alignment mark AM4_c may be different from each other.

In an embodiment, as shown in FIG. 16, two alignment marks are disposed on each of both sides of the first pad electrodes PE1. However, the disclosure is not limited thereto. In some embodiments, two or more alignment marks may be disposed on each of both sides of the first pad electrodes PE1.

Figure 17:
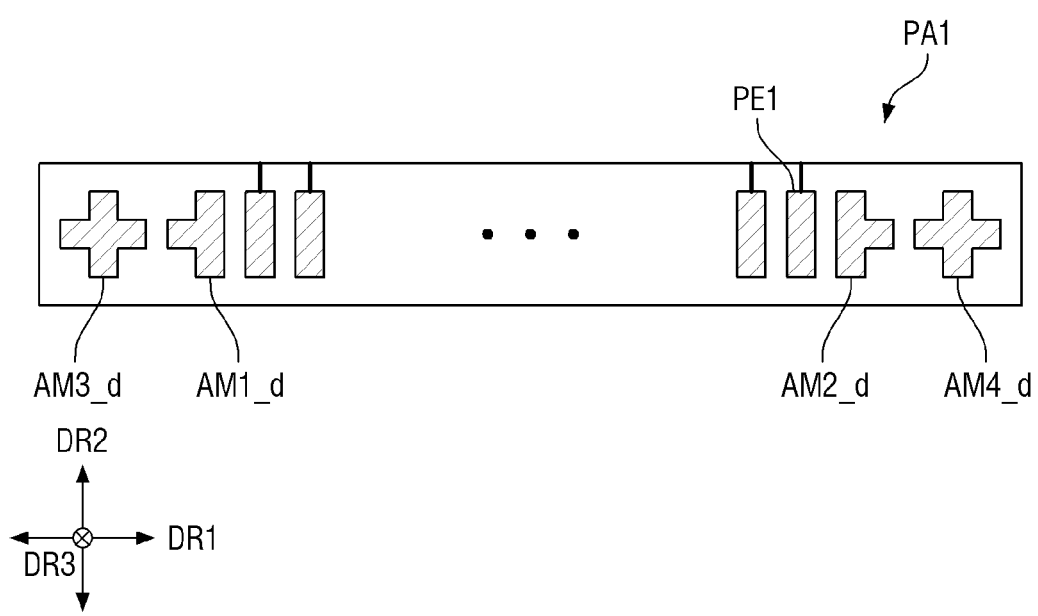
FIG. 17 is a plan view of a first pad area of a display panel according to an embodiment.

FIG. 17 is a plan view of a first pad area of a display panel according to an embodiment.

The embodiment of FIG. 17 is substantially the same as the embodiment of FIG. 16 except that a plurality of alignment marks disposed on each of a side and the other side of first pad electrodes PE1 in the first direction DR1 have different planar shapes.

In such an embodiment, a first alignment mark AM1_d disposed on a side of the first pad electrodes PE1 in the first direction DR1 and a second alignment mark AM2_d disposed on the other side of the first pad electrodes PE1 in the first direction DR1 have the same planar shapes as the first alignment mark AM1 and the second alignment mark AM2 according to the embodiment of FIG. 7, respectively. A third alignment mark AM3_d and a fourth alignment mark AM4_d respectively disposed on a side of the first alignment mark AM1_d in the first direction DR1 and on a side of the second alignment mark AM2_d in the first direction DR1 have the same planar shapes as the first alignment mark AM1_a and the second alignment mark AM2_a according to the embodiment of FIG. 13, respectively.

The arrangement order of the first alignment mark AM1_d and the third alignment mark AM3_d sequentially arranged on a side of the first pad electrodes PE1 in the first direction DR1 and the arrangement order of the second alignment mark AM2_d and the fourth alignment mark AM4_d sequentially arranged on the other side of the first pad electrodes PE1 in the first direction DR1 are not limited to the embodiment illustrated in FIG. 17.

In an embodiment, for example, the third alignment mark AM3_d and the first alignment mark AM1_d may be sequentially disposed on a side of the first pad electrodes PE1 in the first direction DR1, and the fourth alignment mark AM4_d and the second alignment mark AM2_d may be sequentially disposed on the other side of the first pad electrodes PE1 in the first direction DR1.

Figure 18:
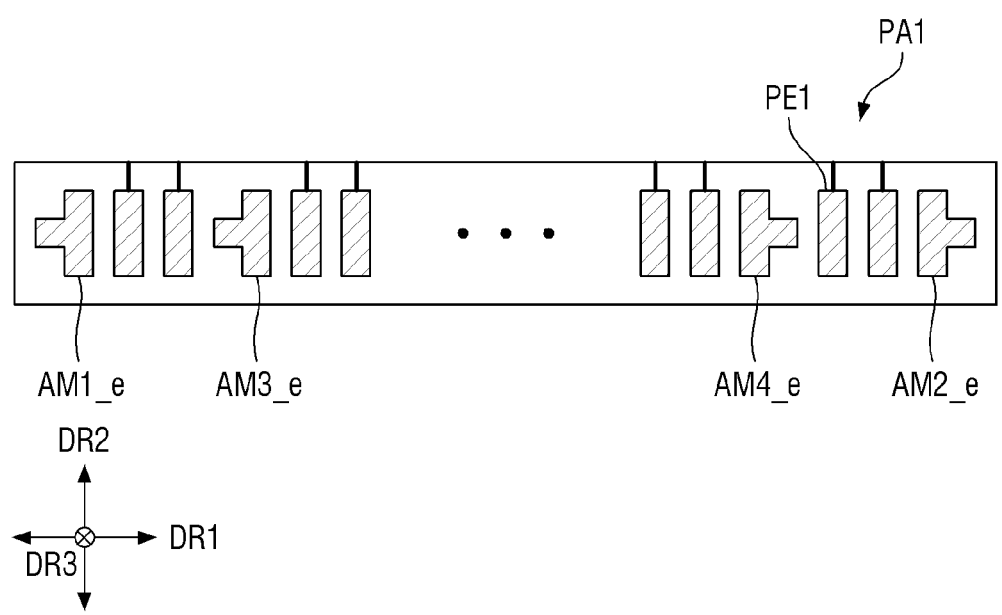
FIG. 18 is a plan view of a first pad area of a display panel according to an embodiment.

FIG. 18 is a plan view of a first pad area of a display panel according to an embodiment.

The embodiment of FIG. 18 is substantially the same as the embodiment of FIG. 16 except for the arrangement positions of a plurality of alignment marks.

In such an embodiment, a first alignment mark AM1_e disposed on a side of a plurality of first pad electrodes PE1 in the first direction DR1 and a second alignment mark AM2_e disposed on the other side of the first pad electrodes PE1 in the first direction DR1 may have the same planar shapes as the first alignment mark AM1 and the second alignment mark AM2 according to the embodiment of FIG. 7, respectively. A third alignment mark AM3_e and a fourth alignment mark AM4_e may have the same planar shape as the first alignment mark AM1_e and the second alignment mark AM2_e, and the third alignment mark AM3_e and a fourth alignment mark AM4_e may be disposed between the first pad electrodes PE1.

Although FIG. 18 shows an embodiment where the planar shapes of the third alignment mark AM3_e and the fourth alignment mark AM4_e are the same as the planar shape of the first alignment mark AM1_e and the planar shape of the second alignment mark AM2_e, the embodiment is limited thereto. In some embodiments, the planar shapes of the third alignment mark AM3_e and the fourth alignment mark AM4_e may be different from the planar shape of the first alignment mark AM1_e and the planar shape of the second alignment mark AM2_e.

In an embodiment, for example, in some embodiments, the planar shape of each of the third alignment mark AM3_e and the fourth alignment mark AM4_e may be a substantially cross shape, like the planar shape of the first alignment mark AM1_a described above with reference to FIG. 14.

In an alternative embodiment, for example, the planar shape of each of the third alignment mark AM3_e and the fourth alignment mark AM4_e may be the same as the planar shape of the first pad electrodes PE1, like the planar shape of the first alignment mark AM1_b described above with reference to FIG. 15.

In the embodiment illustrated in FIG. 18, the first alignment mark AM1_e and the third alignment mark AM3_e as well as the second alignment mark AM2_e and the fourth alignment mark AM4_e are spaced apart from each other with a plurality of first pad electrodes PE1 interposed therebetween. However, the number of first pad electrodes PE1 located between the first alignment mark AM1_e and the third alignment mark AM3_e and between the second alignment mark AM2_e and the fourth alignment mark AM4_e is not limited thereto.

In the embodiments illustrated in FIGS. 16 through 18, since a plurality of alignment marks and a plurality of alignment mark holes are included, a bonding force at both edges of the printed circuit board PCB and the display panel 10 can be further improved. Accordingly, as in the embodiment illustrated in FIGS. 6 through 12, the printed circuit board PCB can be easily bonded to the first pad area PA1 of the display panel 10.

Figure 19:
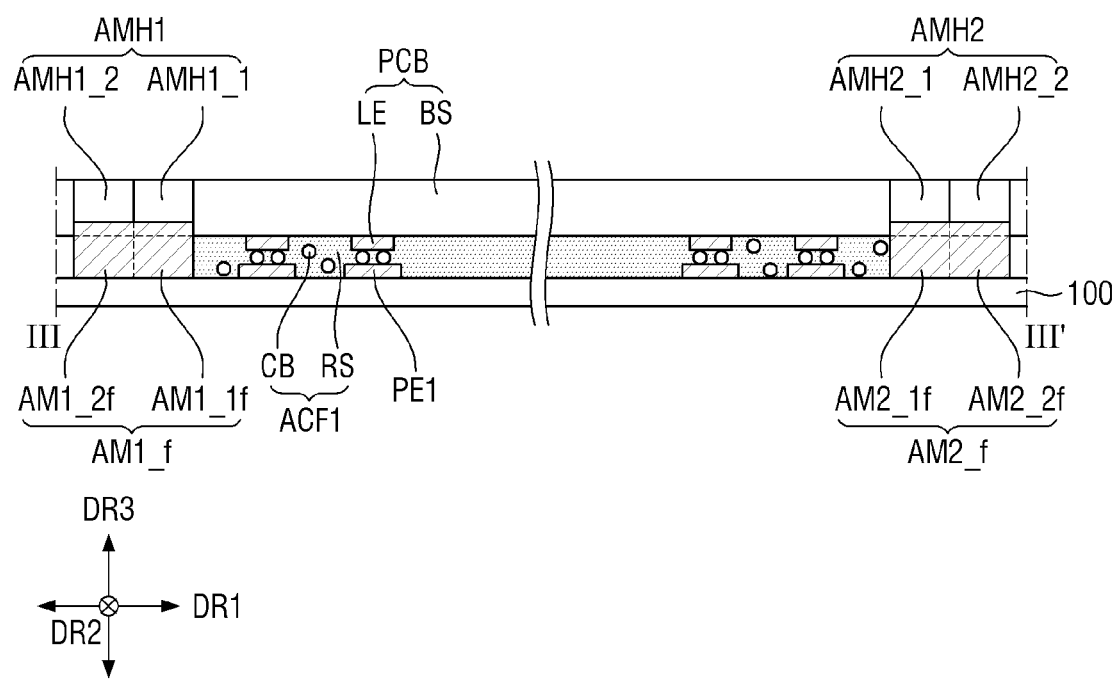
FIG. 19 is a cross-sectional view taken along line of FIG. 11 according to an embodiment.

FIG. 19 is a cross-sectional view taken along line of FIG. 11 according to an embodiment.

The embodiment of FIG. 19 is substantially the same as the embodiment of FIG. 12 except for regions in which an adhesive member RS of a first anisotropic conductive film ACF1 is disposed.

In such an embodiment, the adhesive member RS may be disposed only between a first alignment mark AM1_f and a second alignment mark AM2_f. That is, the first alignment mark AM1_f and the second alignment mark AM2_f may be spaced apart from each other in the first direction DR1 with the adhesive member RS interposed between them.

Accordingly, the first alignment mark AM1_f and the second alignment mark AM2_f may be in direct contact with and physically coupled to a first alignment mark hole AMH1 and a second alignment mark hole AMH2, respectively. That is, at least a portion of side surfaces of a first portion AM1_1f of the first alignment mark AM1_f may directly contact at least a portion of inner surfaces of a first portion AMH1_1 of the first alignment mark hole AMH1, and at least a portion of side surfaces of a second portion AM1_2f of the first alignment mark AM1_f may directly contact at least a portion of inner surfaces of a first portion AMH1_2 of the first alignment mark hole AMH1.

Since the adhesive member RS is disposed only between the first alignment mark AM1_f and the second alignment mark AM2_f, the adhesive member RS may not contact a side surface of the first alignment mark AM1_f located at the first side in the first direction DR1 and may contact a portion of the other surface of the first alignment mark AM1_f located at the second side in the first direction DR1.

In addition, the adhesive member RS may not be disposed on an upper surface of the first alignment mark AM1_f, and the upper surface of the first alignment mark AM1_f may be directly exposed by the first alignment mark hole AHM1.

In such an embodiment, features of the second alignment mark AM2_f and the second alignment mark hole AMH2 are substantially the same as those of the first alignment mark AM1_f and the first alignment mark hole AMH1 described above, and any repetitive detailed description thereof will be omitted.

According to an embodiment, since the adhesive member RS of the first anisotropic conductive film ACF1 is not disposed between the first alignment mark AM1_f and the first alignment mark hole AMH1 and between the second alignment mark AM2_f and the second alignment mark hole AMH2, a space between the side surfaces of the first alignment mark AM1_f and the inner surfaces of the first alignment mark hole AMH1 and a space between the side surfaces of the second alignment mark AM2_f and the inner surfaces of the second alignment mark hole AMH2 are reduced. Accordingly, a physical coupling force between the first alignment mark AM1_f and the first alignment mark hole AMH1 and between the second alignment mark AM2_f and the second alignment mark hole AMH2 may be improved.

Figure 20:
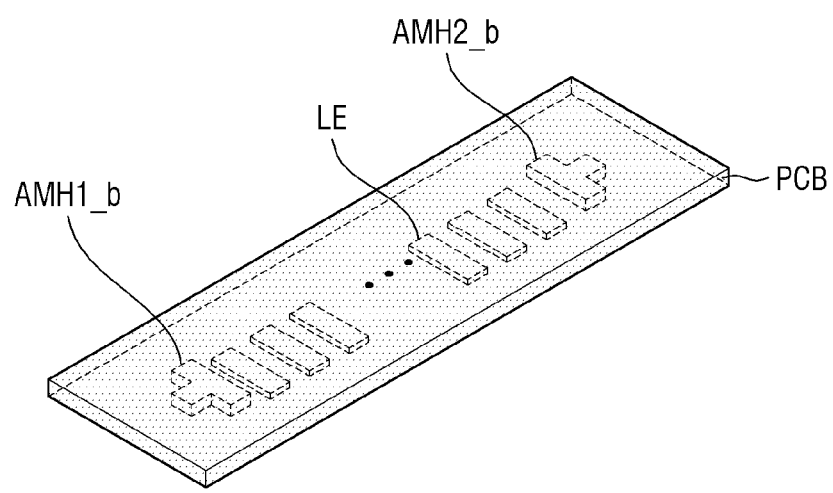
FIG. 20 is a perspective view of a printed circuit board according to an embodiment.
Figure 21:
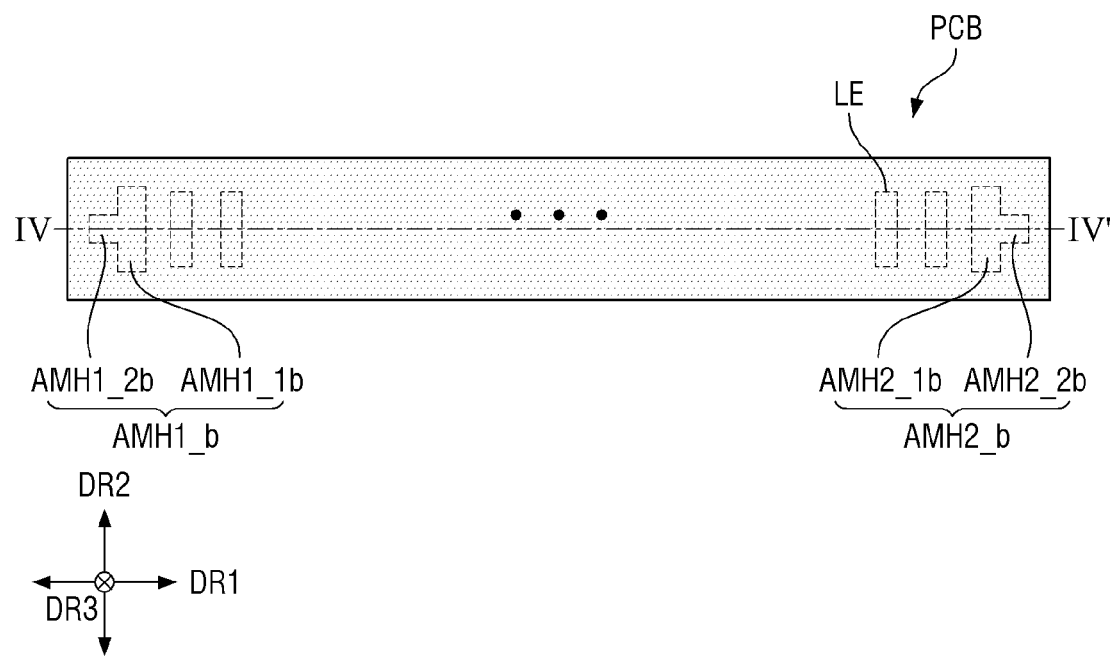
FIG. 21 is a plan view of the printed circuit board of FIG. 20.
Figure 22:
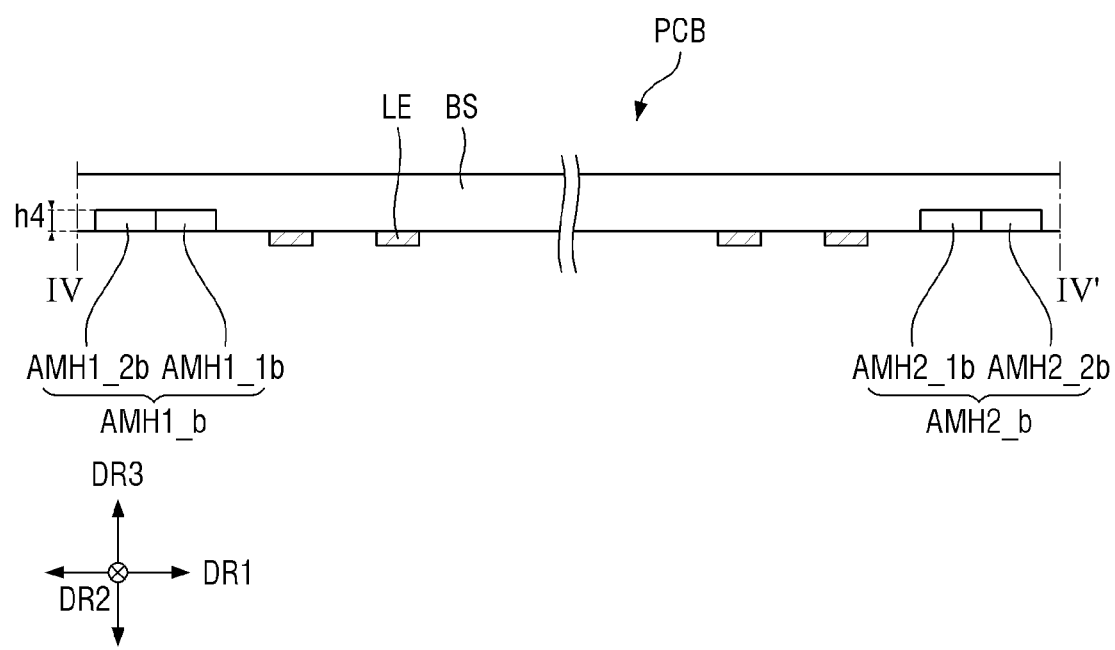
FIG. 22 is a cross-sectional view taken along line IV-IV' of FIG. 21.

FIG. 20 is a perspective view of a printed circuit board PCB according to an embodiment. FIG. 21 is a plan view of the printed circuit board PCB according to the embodiment. FIG. 22 is a cross-sectional view taken along line IV-IV' of FIG. 21.

The embodiment of FIGS. 20 through 22 is substantially the same as the embodiment of FIGS. 9 and 10 except that the printed circuit board PCB includes a first alignment mark accommodating portion AMH1_b and a second alignment mark accommodating portion AMH2_b having different shapes from the first alignment mark hole AMH1 and the second alignment mark hole AMH2 shown in FIGS. 9 and 10.

Referring to FIGS. 20 through 22, the printed circuit board PCB may include lead electrodes LE arranged along the first direction DR1, the first alignment mark accommodating portion AMH1_b disposed on a side of the lead electrodes LE in the first direction DR1, and the second alignment mark accommodating portion AMH2_b disposed on the other side of the lead electrodes LE in the first direction DR1.

In such an embodiment, a base substrate BS of the printed circuit board PCB may include an upper surface and a lower surface opposite the upper surface. A plurality of lead electrodes LE arranged along the first direction DR1 may be disposed on the lower surface of the base substrate BS. The lower surface of the base substrate BS may be a surface facing a first pad area PA1 when the printed circuit board PCB to be described later is attached to the first pad area PA1.

The first alignment mark accommodating portion AMH1_b and the second alignment mark accommodating portion AMH2_b may be defined by a portion recessed from the lower surface toward the upper surface of the base substrate BS. That is, unlike the first alignment mark hole AMH1 and the second alignment mark hole AMH2 according to the embodiment illustrated in FIGS. 9 and 10, the first alignment mark accommodating portion AMH1_b and the second alignment mark accommodating portion AMH2_b may not completely penetrate the printed circuit board PCB in the thickness direction and may be recessed from a lower surface toward an upper surface of the printed circuit board PCB.

The planar shapes of the first alignment mark accommodating portion AMH1_b and the second alignment mark accommodating portion AMH2_b may be the same as the planar shapes of the first alignment mark hole AMH1 and the second alignment mark hole AMH2 according to the embodiment illustrated in FIG. 9.

That is, the first alignment mark accommodating portion AMH1_b may include a first portion AMH1_1b extending in the second direction DR2 in a plan view and a second portion AMH1_2b extending from the middle of the first portion AMH1_1b toward the first side in the first direction DR1.

Like the first alignment mark accommodating portion AMH1_b, the second alignment mark accommodating portion AMH2_b may include a first portion AMH2_1b extending in the second direction DR2 in a plan view and a second portion AMH2_2b extending from the middle of the first portion AMH2_1b toward the second side in the first direction DR1. However, the disclosure is not limited thereto, and the first alignment mark accommodating portion AMH1_b and the second alignment mark accommodating portion AMH2_b may also have various shapes corresponding to the shapes of alignment marks disposed in the first pad area PA1 as described above.

A depth h4 of the first alignment mark accommodating portion AMH1_b and the second alignment mark accommodating portion AMH2_b in the third direction DR3, that is, in the thickness direction may be smaller than the thickness h1 of the first alignment mark AM1 and the second alignment mark AM2 in the third direction DR3 in FIG. 8. However, the disclosure is not limited thereto. In some embodiments, the third direction, depth h4 of the first alignment mark accommodating portion AMH1_*b* and the second alignment mark accommodating portion AMH2_*b* may be equal to the thickness h1 of the first alignment mark AM1 and the second alignment mark AM2 in the third direction DR3 in FIG. 8 or may be greater than the thickness h1 of the first alignment mark AM1 and the second alignment mark AM2 in the third direction DR3.

Figure 23:
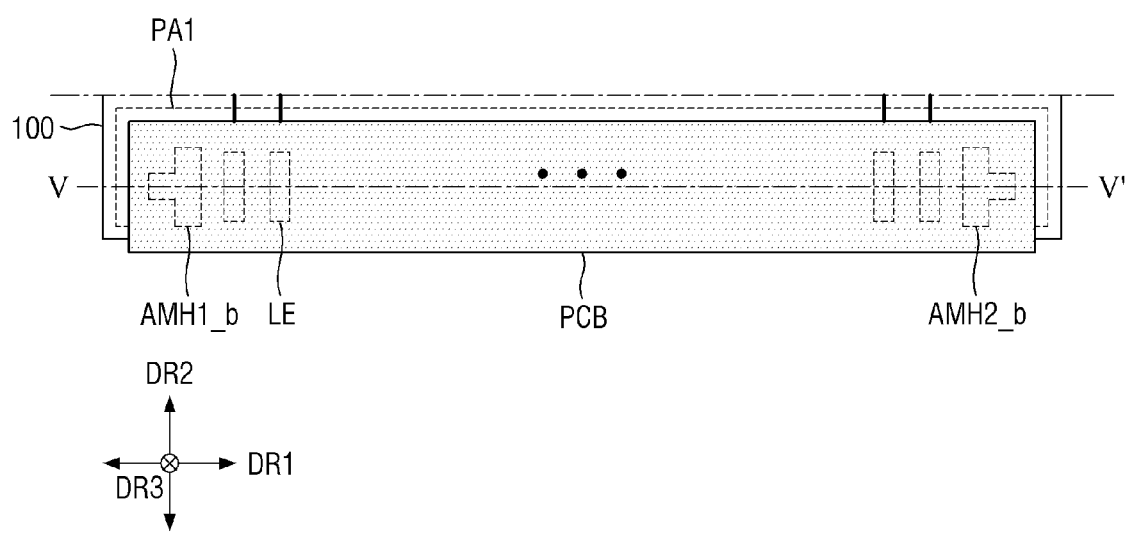
FIG. 23 is a plan view illustrating a first pad area of a display panel according to an embodiment and a printed circuit board attached to the first pad area.
Figure 24:
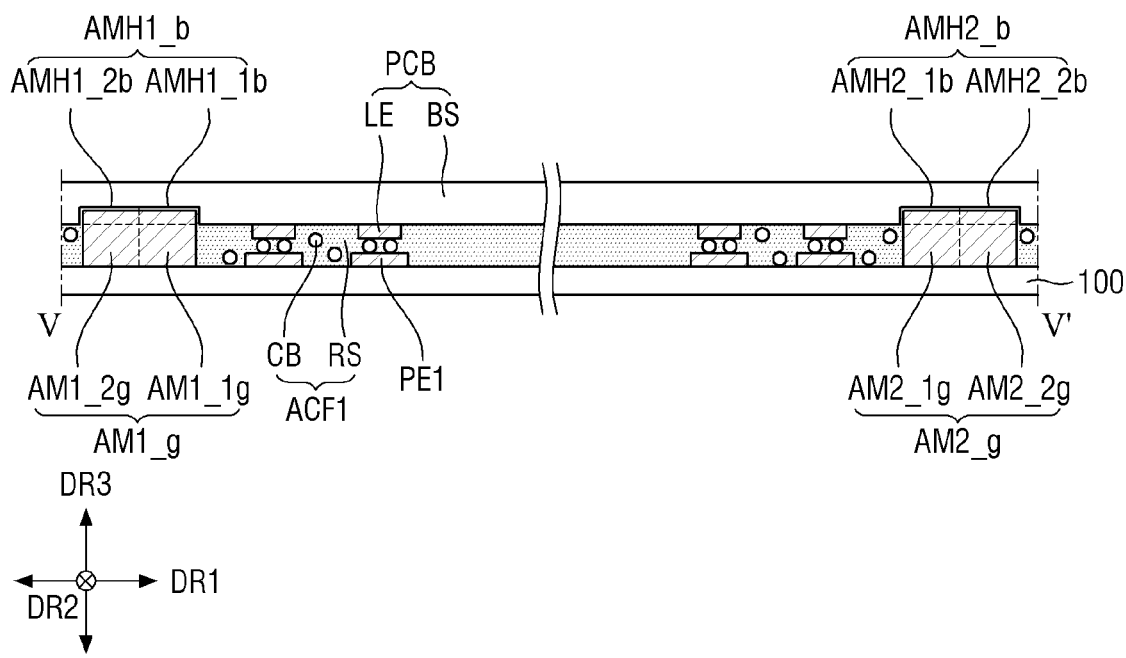
FIG. 24 is a cross-sectional view taken along line V-V' of FIG. 23.

FIG. 23 is a plan view illustrating a first pad area PA1 of a display panel 10 according to an embodiment and a printed circuit board PCB attached to the first pad area PA1. FIG. 24 is a cross-sectional view taken along line V-V' of FIG. 23.

Referring to FIGS. 23 and 24, a first alignment mark AM1_*g* and a second alignment mark AM2_*g* may be respectively physically coupled to a first alignment mark accommodating portion AMH1_*b* and a second alignment mark accommodating portion AMH2_*g* with an adhesive member RS interposed therebetween. That is, a first portion AM1_1*g* of the first alignment mark AM1_*g* may be accommodated in a first portion AMH1_1*b* of the first alignment mark accommodating portion AMH1_*b*, and a second portion AM1_2*g* of the first alignment mark AM1_*g* may be accommodated in a second portion AMH1_2*b* of the first alignment mark accommodating portion AMH1_*b*.

In such an embodiment, at least a portion of side surfaces of the first portion AM1_1*g* of the first alignment mark AM1_*g* may face at least a portion of inner walls of the first portion AMH1_1*b* of the first alignment mark accommodating portion AMH1_*b* in the second direction DR2 with the adhesive member RS interposed between them. Likewise, at least a portion of side surfaces of the second portion AM1_2*g* of the first alignment mark AM1_*g* may face at least a portion of inner walls of the second portion AMH1_2*b* of the first alignment mark accommodating portion AMH1_*b* in the second direction DR2 with the adhesive member RS interposed between them.

In such an embodiment, an upper surface of the first alignment mark AM1_*g* may face a lower surface of the first alignment mark accommodating portion AMH1_*b* with the adhesive member RS interposed between them. That is, since the first alignment mark accommodating portion AMH1_*b* is recessed from a lower surface toward an upper surface of a base substrate BS, the lower surface of the first alignment mark accommodating portion AMH1_*b* may face the upper surface of the first alignment mark AM1_*g* in the third direction DR3.

The upper surface of the first alignment mark AM1_*g* and the adhesive member RS located on the upper surface of the first alignment mark AM1_*g* may be entirely covered by the first alignment mark accommodating portion AMH1_*b*. Accordingly, unlike in the embodiment illustrated in FIGS. 11 and 12, in an embodiment of FIGS. 23 and 24, when the printed circuit board PCB is attached to the first pad area PA1 of a first substrate 100, the adhesive member RS located on the upper surface of the first alignment mark AM1_*g* is not exposed.

In such an embodiment, features of the second alignment mark AM2_*g* and the second alignment mark accommodating portion AMH2_*b* are substantially the same as those of the first alignment mark AM1_*g* and the first alignment mark accommodating portion AMH1_*b* described above, and any repetitive detailed description thereof will be omitted.

Also in such an embodiment, since the first alignment mark AM1_*g* and the second alignment mark AM2_*g* are physically coupled to the first alignment mark accommodating portion AMH1_*b* and the second alignment mark accommodating portion AMH2_*b*, respectively, a bonding force at both edges of the printed circuit board PCB and the display panel 10 can be improved. Accordingly, an alignment tolerance of first pad electrodes PE1 disposed in the printed circuit board PCB and the first pad area PA1 can be reduced.

A display device according to an embodiment may include alignment marks located at opposing sides of a plurality of pad electrodes and having a greater thickness than the pad electrodes and alignment mark holes defined in a printed circuit board attached to a pad area and physically coupled to the alignment marks.

Accordingly, in such an embodiment, when the printed circuit board is bonded to the pad area of a display panel, lead electrodes disposed on a side surface of the printed circuit board can be effectively prevented from being lifted by a difference in thermal expansion coefficient between a substrate of the display panel and the printed circuit board, and an alignment tolerance between the pad electrodes and the lead electrodes can be reduced.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
    a substrate comprising a display area including a plurality of pixels and a non-display area located around the display area and including a pad area; and
    a circuit board attached to the pad area,
    wherein
        a plurality of pad electrodes arranged along a first direction is disposed on the substrate in the pad area,
        a first alignment mark located at a side of the pad electrodes in the first direction and protruding more than the pad electrodes in a thickness direction of the substrate is disposed on the substrate in the pad area, and
    wherein the circuit board comprises:
        a base portion; and
        a plurality of lead electrodes disposed on the base portion and respectively facing the pad electrodes,
        wherein
        a first alignment mark hole is defined through the base portion in the thickness direction at a side of the lead electrodes in the first direction,
        a shape of the first alignment mark is the same as a shape of the first alignment mark hole, and
        the first alignment mark is accommodated in the first alignment mark hole.

2. The display device of claim 1, wherein the first alignment mark includes a same material as the pad electrodes.

3. The display device of claim 1, wherein a thickness of the pad electrodes is in a range of ¼ to ⅓ of a thickness of the first alignment mark.

4. The display device of claim 1, wherein the first alignment mark comprises a first portion extending in a second direction intersecting the first direction and a second portion extending from the first portion toward a first side in the first direction.

5. The display device of claim 4, wherein the first alignment mark further comprises a third portion extending from the first portion toward a second side opposite to the first side in the first direction.

6. The display device of claim 1, wherein the first alignment mark has a same shape as the pad electrodes.

7. The display device of claim 1, wherein
a second alignment mark located at an opposing side of the pad electrodes in the first direction and protruding more than the pad electrodes in the thickness direction is disposed on the substrate in the pad area,
a second alignment mark hole is defined through the base portion in the thickness direction at an opposing side of the lead electrodes in the first direction,
a shape of the second alignment mark is the same as a shape of the second alignment mark hole, and
the second alignment mark is accommodated in the second alignment mark hole.

8. The display device of claim 7, wherein the shape of the first alignment mark and the shape of the second alignment mark are different from each other.

9. The display device of claim 7, wherein
a third alignment mark located at a side of the first alignment mark in the first direction and protruding more than the pad electrodes in the thickness direction is disposed on the substrate in the pad area;
wherein a third alignment mark hole is defined through the base portion in the thickness direction at a side of the first alignment mark hole in the first direction,
a shape of the third alignment mark is the same as a shape of the third alignment mark hole, and
the third alignment mark is accommodated in the third alignment mark hole.

10. The display device of claim 7, wherein
a third alignment mark located between the pad electrodes and protruding more than the pad electrodes in the thickness direction is disposed on the substrate in the pad area;
wherein a third alignment mark hole is defined through the base portion in the thickness direction at a position between the lead electrodes,
wherein the third alignment mark is accommodated in the third alignment mark hole.

11. The display device of claim 1, wherein the circuit board includes a rigid material.

12. The display device of claim 1, wherein the first alignment mark is surrounded by inner surfaces of the first alignment mark hole in a plan view.

13. The display device of claim 12, wherein side surfaces of the first alignment mark face the inner surfaces of the first alignment mark hole.

14. The display device of claim 1, further comprising:
an anisotropic conductive film disposed between the pad area of the substrate and the circuit board,
wherein the anisotropic conductive film comprises an adhesive member and a plurality of conductive balls dispersed in the adhesive member,
wherein the pad electrodes and the lead electrodes are electrically connected to each other through the conductive balls.

15. The display device of claim 14, wherein the anisotropic conductive film directly contacts side surfaces and an upper surface of the first alignment mark and inner surfaces of the first alignment mark hole and fills the first alignment mark hole.

16. A display device comprising:
a substrate comprising a display area including a plurality of pixels and a non-display area located around the display area and including a pad area;
a circuit board attached to the pad area; and
a plurality of driving chips arranged along a first direction on the substrate in the non-display area between the display area and the pad area and electrically connected to the pixels and the circuit board,
wherein
a plurality of pad electrodes arranged along the first direction and a first alignment mark located at a side of the pad electrodes in the first direction and protruding more than the pad electrodes in a thickness direction of the substrate are disposed on the substrate in the pad area, and
the circuit board comprises:
a base portion comprising a first surface and a second surface opposite to the first surface,
a plurality of lead electrodes disposed on the second surface of the base portion and respectively facing the pad electrodes, and
a first alignment mark accommodating portion defined at a side of the lead electrodes in the first direction and recessed from the second surface toward the first surface of the base portion,
wherein
the first alignment mark and the first alignment mark accommodating portion have a same shape as each other, and
the first alignment mark is accommodated in the first alignment mark accommodating portion.

17. The display device of claim 16, wherein
a second alignment mark located at an opposing side of the pad electrodes in the first direction, protruding more than the pad electrodes in the thickness direction, and having a same shape as the first alignment mark is disposed on the substrate in the pad area; and
the circuit board further comprises a second alignment mark accommodating portion defined at an opposing side of the lead electrodes in the first direction and recessed from the second surface toward the first surface of the base portion,
the second alignment mark and the second alignment mark accommodating portion has a same shape as each other, and
the second alignment mark is accommodated in the second alignment mark accommodating portion.

18. The display device of claim 17, further comprising:
an anisotropic conductive film disposed between the pad area of the substrate and the circuit board,
wherein the anisotropic conductive film comprises an adhesive member and a plurality of conductive balls dispersed in the adhesive member,
wherein the pad electrodes and the lead electrodes are electrically connected to each other through the conductive balls.

19. The display device of claim 18, wherein the anisotropic conductive film is disposed between the first alignment mark and the first alignment mark accommodating portion and between the second alignment mark and the second alignment mark accommodating portion.

20. The display device of claim 18, wherein
the anisotropic conductive film does not overlap the first alignment mark, the first alignment mark accommodating portion, the second alignment mark and the second alignment mark accommodating portion, the first alignment mark directly contacts the first alignment mark accommodating portion, and the second alignment mark directly contacts the second alignment mark accommodating portion.

* * * * *